(12) United States Patent  (10) Patent No.: US 8,399,899 B2
Matsuda et al.  (45) Date of Patent: Mar. 19, 2013

(54) LIGHT EMITTING DEVICE

(75) Inventors: Makoto Matsuda, Osaka (JP); Toyonori Uemura, Osaka (JP); Toshio Hata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 115 days.

(21) Appl. No.: 12/827,319

(22) Filed: Jun. 30, 2010

(65) Prior Publication Data

US 2011/0001156 A1 Jan. 6, 2011

(30) Foreign Application Priority Data

Jul. 1, 2009 (JP) ................................. 2009-157133

(51) Int. Cl.
*H01L 33/44* (2010.01)
(52) U.S. Cl. ........ 257/98; 257/88; 257/89; 257/E33.061
(58) Field of Classification Search ............... 257/88–89, 257/98; 438/23; 313/512
See application file for complete search history.

(56) References Cited

U.S. PATENT DOCUMENTS

| | | | |
|---|---|---|---|
| 6,583,550 B2 * | 6/2003 | Iwasa et al. | 313/485 |
| 2004/0113267 A1 * | 6/2004 | Yogo et al. | 257/723 |
| 2007/0030611 A1 | 2/2007 | Cho et al. | |
| 2011/0001156 A1 | 1/2011 | Matsuda et al. | |
| 2011/0316011 A1 | 12/2011 | Ito et al. | |

FOREIGN PATENT DOCUMENTS

| | | |
|---|---|---|
| CN | 1909238 A | 2/2007 |
| CN | 101944565 A | 1/2011 |
| CN | 102334201 A | 1/2012 |
| JP | 63-180957 A | 11/1988 |
| JP | 63-180957 U | 11/1988 |
| JP | 11-298041 A | 10/1999 |
| JP | 11-307815 A | 11/1999 |
| JP | 2006-93697 A | 4/2006 |
| JP | 2007-116095 A | 5/2007 |
| JP | 2007-204547 A | 11/2007 |
| JP | 2007-294547 A | 11/2007 |
| JP | 2007-324205 A | 12/2007 |
| JP | 2008-85109 A | 4/2008 |

* cited by examiner

*Primary Examiner* — Dung A. Le
(74) *Attorney, Agent, or Firm* — Nixon & Vanderhye P.C.

(57) ABSTRACT

A light emitting device includes: a substrate; an LED chip provided on a main surface of the substrate; and a printed resistor element connected in parallel with the LED chip, the printed resistor element being provided in at least one of regions (i) on the main surface of the substrate, (ii) on a back surface of the substrate, and (iii) inside the substrate. According to the arrangement, it is possible to provide: a light emitting device which can emit light having preferable luminance without a reduction in optical output by suppressing light shielding and light absorption of light emitted from the LED toward the outside; and a method for manufacturing the light emitting device.

19 Claims, 17 Drawing Sheets

FIG. 5(a)
FIG. 5(d)
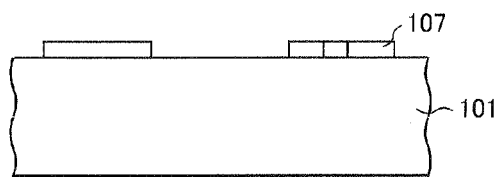
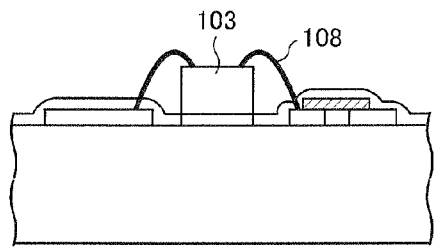
FIG. 5(b)
FIG. 5(e)
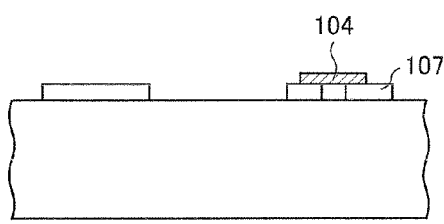
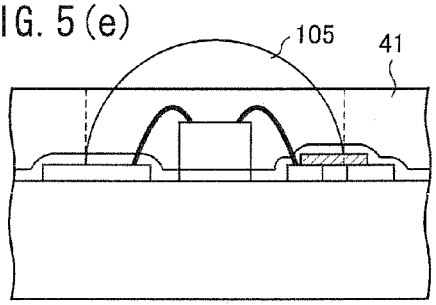
FIG. 5(c)
FIG. 5(f)
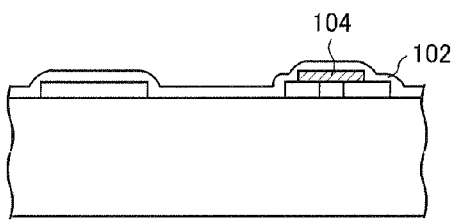
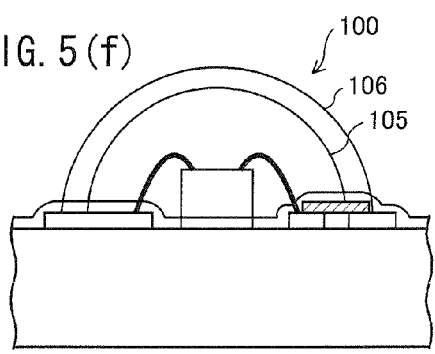

US 8,399,899 B2

LIGHT EMITTING DEVICE

This Nonprovisional application claims priority under 35 U.S.C. §119(a) on patent application Ser. No. 2009-157133 filed in Japan on Jul. 1, 2009, the entire contents of which are hereby incorporated by reference.

TECHNICAL FIELD

The technology presented herein relates to: a light emitting device including a semiconductor light emitting element provided on a substrate, and a protective element connected in parallel with the semiconductor light emitting element; and a method for manufacturing the light emitting device.

BACKGROUND AND SUMMARY

In recent years, there has been an improvement in efficiency of an LED (Light Emitting Diode). With the improvement, the LED has been widely applied to a backlight of a display device, and illumination devices as a light source consuming less energy than a light bulb or a fluorescent lamp. In such devices, energy efficiency is particularly important.

Here, the LED, particularly a gallium nitride LED, is easily broken down due to electrostatic discharge. That is, the LED has a low reverse withstand voltage. As a measure against such a problem, a technique of connecting a zener diode (ZD) in antiparallel with the LED has been disclosed (see Patent Literature 1, for example).

The arrangement employing the ZD protects the LED from an excess voltage by allowing (i) an excess current generated by a forward excess voltage to be bypassed due to a zener breakdown, and (ii) an excess current generated by a reverse excess voltage to be bypassed by using the ZD as a normal forward diode. Further, in a case where a forward voltage is applied to the LED, no current flows across the ZD, and no energy loss is generated. This is because the forward voltage applied to the LED is less than a zener breakdown voltage of the ZD.

However, the use of the ZD has disadvantages of: difficulty in manufacturing the ZD as compared with a resistor; a big burden of the provision of the ZD in accordance with the LED, or the like; low long-term reliability as compared with a resistor; high cost of components of the ZD.

Meanwhile, a technique of connecting resistors in parallel with the LED has been disclosed (see Patent Literatures 2 and 3, for example). According to the technique disclosed in Patent Literature 2, a plurality of LEDs are connected in series, and resistors are connected in parallel with the plurality of LEDs, respectively. In the arrangement, even if wire breakage occurs in any of the plurality of LEDs, the other LEDs would not be turned off. This is because each of the resistors functions as a bypass resistor. Further, Patent Literature 3 discloses a technique for arranging resistors in such an LED element set that a plurality of LEDs are provided in a single package. According to the technique, a plurality of variable resistors are connected in parallel with the plurality of LEDs, respectively, so that luminance of each of the plurality of LEDs can be adjusted. Furthermore, as an example of provision of the resistor connected to the LED, there has been a disclosure of a technique of providing a thick film resistor in an LED package (see Patent Literature 4, for example).

Citation List

Patent Literature 1
Japanese Patent Application Publication, Tokukaihei, No. 11-298041 A (1999) (Publication Date: Oct. 29, 1999)
Patent Literature 2
Japanese Patent Application Publication, Tokukaihei, No. 11-307815 A (1999) (Publication Date: Nov. 5, 1999)
Patent Literature 3
Japanese Patent Application Publication, Tokukai, No. 2007-294547 A (Publication Date: Nov. 8, 2007)
Patent Literature 4
Japanese Utility Model Application Publication, Jitsukai-sho, No. 63-180957 U (1988) (Publication Date: Nov. 22, 1988)

However, any of the techniques disclosed in Patent Literatures 1 through 4 has a problem of a reduction in luminance of the light emitted from the light emitting device. This reduction results from a reduction in optical output due to optical shielding and optical absorption of the light emitted from the LED toward the outside.

For example, with the technique disclosed in Patent Literature 1, in a case where the ZD is provided in the vicinity of an LED chip, light emitted from the LED chip is shielded and absorbed by the ZD due to a height of the ZD. This causes a reduction in luminance of the light emitting device and a bad influence on a light distribution property.

Further, although the ZD is relatively smaller than the LED chip, it is necessary to ensure a certain area for the provision of the ZD due to its cuboid shape with a base of 200 µm×200 µm. Therefore, in a case where the LED chip and the ZD are provided on the same surface, it is difficult to provide the LED chip in a center of the surface due to a limitation on the layout of the LED chip and the ZD. In a case of a large LED chip or a plurality of LED chips, this problem becomes more significant.

Furthermore, a sealing resin, a package shape, and the like are designed so that the LED chip and the ZD can be provided inside of these. This causes an entire package to be larger. Moreover, the ZD has the aforementioned disadvantages of: difficulty in manufacturing the ZD; the big burden of the provision of the ZD; and low long-term reliability.

Meanwhile, with any of the techniques disclosed in Patent Literatures 2 through 4, the light emitted from the LED chip is absorbed by the resistor. This causes a reduction in luminance of the light emitting device, and a bad influence on the light distribution property. Due to a certain size of a resistor, a total amount of optical absorption becomes larger as more resistors are provided.

The present technology is made in view of the conventional problems. A feature of the present technology is to provide: a light emitting device which can emit light having preferable luminance without a reduction in optical output by suppressing optical shielding and optical absorption of light emitted from an LED toward the outside; and a method for manufacturing the light emitting device.

In order to attain the above feature a light emitting device of the example embodiments presented herein includes: a substrate; a semiconductor light emitting element provided on a main surface of the substrate; and a protective element connected in parallel with the semiconductor light emitting element, the protective element being a printed resistor provided in at least one of regions (i) on the main surface of the substrate, (ii) on a back surface of the substrate, and (iii) inside the substrate.

Further, in order to attain the above feature a method of the present embodiment, for manufacturing a light emitting device which includes: a substrate; a semiconductor light emitting element provided on a main surface of the substrate; and a protective element connected in parallel with the semiconductor light emitting element, said method including the step of: providing a printed resistor, as the protective element, in at least one of regions (i) on the main surface of the substrate, (ii) on a back surface of the substrate, and (iii) inside the substrate.

According to the arrangement described above, the protective element is a printed resistor having a thin film shape. Therefore, the protective element has no limitation on its layout. Further, since the protective element is the printed resistor having the thin film shape, and has no limitation on its layout, it becomes possible for the protective element to be easily covered with a milky white glass layer or the like. This suppresses optical shielding and optical absorption, by the protective element, of the light emitted from the semiconductor light emitting element. Therefore, the light emitting device can emit light having preferable luminance without a reduction in optical output by suppressing optical shielding and optical absorption of the light emitted from the semiconductor light emitting element toward the outside. Further, it is also possible to manufacture the light emitting device at low cost.

As described above, a light emitting device of the present embodiment includes a protective element connected in parallel with a semiconductor element provided on a main surface of the substrate, the protective element being a printed resistor provided in at least one of regions (i) on the main surface of the substrate, (ii) on a back surface of the substrate, and (iii) inside the substrate. Therefore, the light emitting device can emit light having preferable luminance without a reduction in optical output by suppressing optical shielding and optical absorption of light emitted from the semiconductor light emitting element toward the outside.

BRIEF DESCRIPTION OF DRAWINGS

FIG. 5(a) is a cross-sectional view illustrating one of the manufacturing steps of the light emitting device.

FIG. 5(b) is a cross-sectional view illustrating one of the manufacturing steps of the light emitting device.

FIG. 5(c) is a cross-sectional view illustrating one of the manufacturing steps of the light emitting device.

FIG. 5(d) is a cross-sectional view illustrating one of the manufacturing steps of the light emitting device.

FIG. 5(e) is a cross-sectional view illustrating one of the manufacturing steps of the light emitting device.

FIG. 5(f) is a cross-sectional view illustrating one of the manufacturing steps of the light emitting device.

DESCRIPTION OF EMBODIMENTS

[Embodiment 1]

One embodiment is described below with reference to drawings.

(Arrangement of Light Emitting Device)

Figure 1:
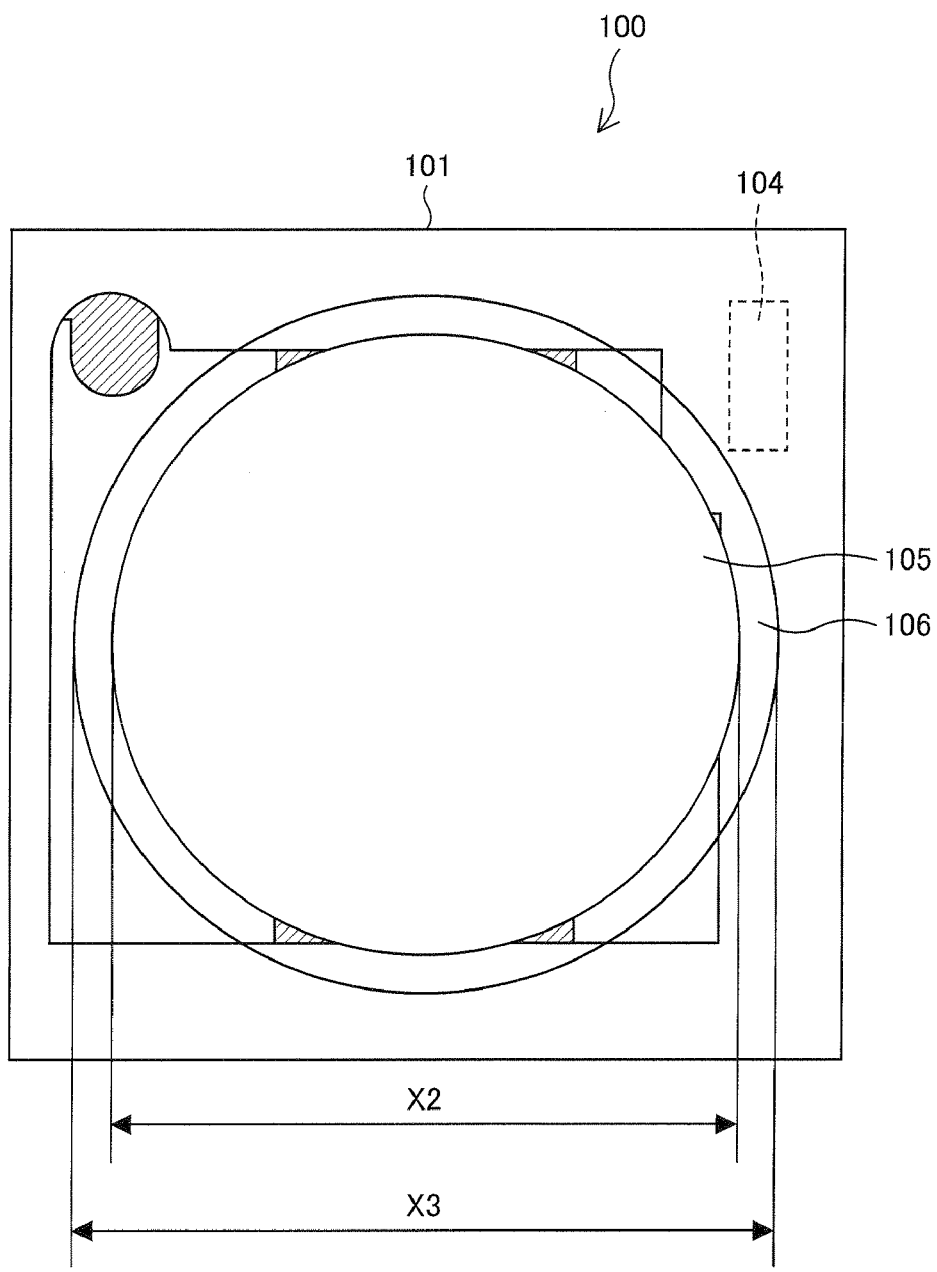
FIG. 1 is a top view illustrating a light emitting device in accordance with one embodiment.
Figure 2A:
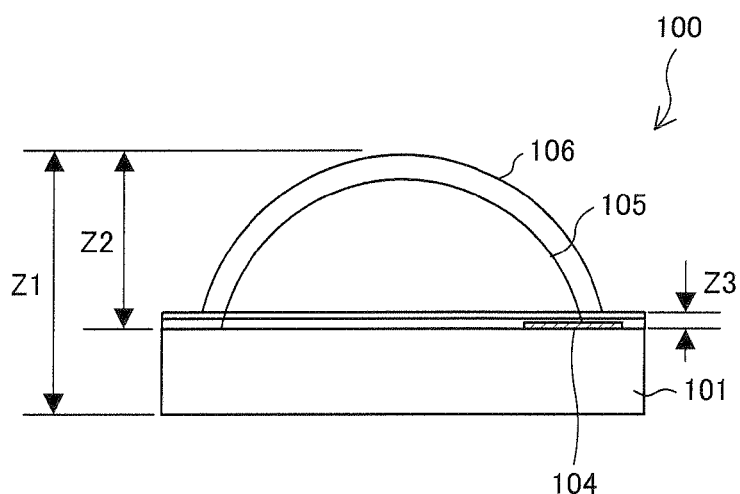
FIG. 2(a) is a side view illustrating the light emitting device.
Figure 2B:
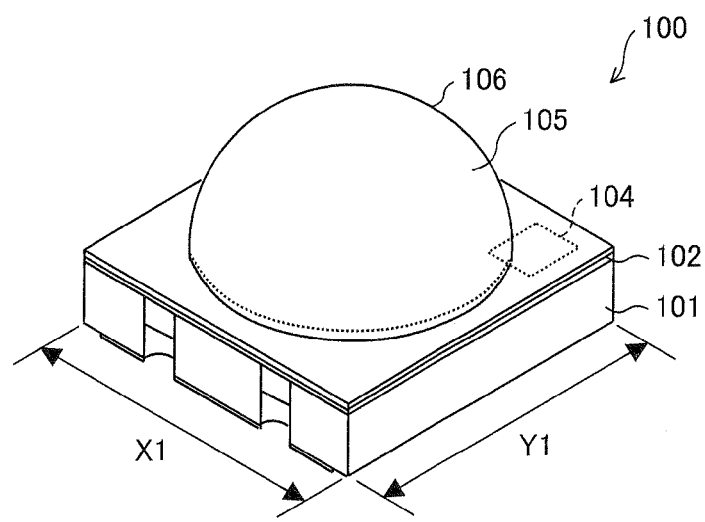
FIG. 2(b) is a perspective view illustrating the light emitting device.
Figure 3:
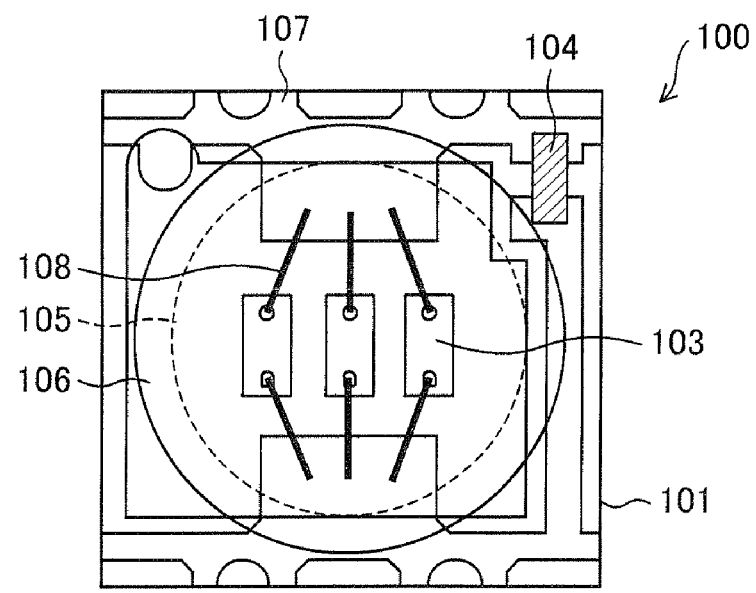
FIG. 3 is a perspective view obtained in a case where the light emitting device is viewed from above.

FIG. 1 is a top view illustrating an example of an arrangement of a light emitting device 100 of the present embodiment. FIG. 2(a) is a side view illustrating the light emitting device 100 illustrated in FIG. 1. FIG. 2(b) is a perspective view illustrating the light emitting device 100 illustrated in FIG. 1. FIG. 3 is a perspective view obtained in a case where the light emitting device 100 of FIG. 1 is viewed from above.

The light emitting device 100 includes: a substrate 101; a glass layer 102; LED chips 103 (semiconductor light emitting elements); a printed resistor element 104; a fluorescent material-containing resin layer 105; and a transmissive resin layer 106 (see FIGS. 1 through 3).

The substrate 101 is a ceramic substrate made from ceramics. The glass layer 102, the LED chips 103, the printed resistor element 104, the fluorescent material-containing resin layer 105, and the transmissive resin layer 106 are provided on one surface (hereinafter, referred to as "main surface") of the substrate 101.

A wiring pattern 107 is directly provided on the main surface of the substrate 101 (i) so as to extend around (but not to extend in) a region in which the LED chips 103 are provided, (ii) so as to include at least: surface electrodes to be electrically connected to components provided inside the light emitting device 100; and a conducting path for connecting the surface electrodes to the outside. The surface electrodes are: a cathode electrode 107a and an anode electrode 107b (electrodes for the semiconductor light emitting elements) between which the LED chips 103 are electrically connected via their electrodes; and electrodes 107c and 107d between which the printed resistor element 104 (anode electrode and cathode electrode, electrodes for a protective element) is electrically connected (as described later with reference to FIG. 6). Further, the wiring pattern 107 includes a cathode mark 107e via which a cathode side is recognized.

The LED chip 103 is a blue LED having an emission peak wavelength of 450 nm. However, the present embodiment is not limited to this. An ultraviolet (near-ultraviolet) LED chip having an emission peak wavelength in a range of 390 nm to 420 nm, for example can be used as the LED chip 103. Such an ultraviolet LED chip can further increase light emitting efficiency. The LED chip 103 has a chip shape with a long side of 550 μm, a short side of 280 μm, and a height of 120 μm, for example.

The LED chip 103 is directly provided on the main surface of the substrate 101 with its light emitting surface face up. The LED chip 103 is fixed to the main surface via a die bonding paste (not illustrated) (die bonding). Here, a plurality of LED chips 103 (three LED chips 103 in the present embodiment) are provided in predetermined positions, respectively, so as to achieve a predetermined light emitting amount. For example, the plurality of LED chips 103 are provided with equal intervals such that their long sides are juxtaposed. Electrodes (an anode electrode and a cathode electrode) are provided on a light emitting surface of each of the plurality of LED chips 103.

Each of the plurality of LED chips 103 is electrically connected, via its electrodes, between the cathode electrode 107a and anode electrode 107b of the substrate 101, by wire bonding with the use of wiring lines 108. This causes the plurality of LED chips 103 to be connected in parallel with each other between the cathode electrode 107a and the anode electrode 107b. The wiring line 108 is made of gold, for example. The conductive connections via the wiring lines 108 allow electric power to be supplied to the plurality of LED chips 103, via the surface electrodes (the cathode electrode 107a and the anode electrode 107b) of the substrate 101.

The printed resistor element 104 is a thin film resistor element, which is obtained by baking and fixing a printed paste resistor component. The printed resistor element 104 functions as a protective element for protecting the LED chips 103. The printed resistor element 104 is directly provided on the main surface so as to be stacked on and bridge between ends of the respective electrodes 107c and 107d. This causes the printed resistor element 104 to be electrically connected between the electrodes 107c and 107d. A material of the printed resistor element 104, and a method for providing the printed resistor element 104 will be described later.

The glass layer 102 is a layer made of milky-white glass. The glass layer 102 is provided on the main surface of the substrate 101 so as to cover the printed resistor element 104, the wiring pattern 107 (other than the cathode electrode 107a, the anode electrode 107b, and the cathode mark 107e), and a part of the main surface, which part corresponds to a region around the LED chips 103. In other words, the glass layer 102 is provided so as to cover the main surface side of the substrate 101, while having an opening in which (i) the region in which the plurality of LED chips 103 are provided, (ii) a region in the vicinity of the region in which the plurality of LED chips 103 are provided, (iii) the cathode electrode 107a, (iv) the anode electrode 107b, and (v) the cathode mark 107e are exposed. The opening is to become a wire bonding region.

Note that no glass layer 102 is provided in (i) the region in which the plurality of LED chips 103 are provided and (ii) the region in the vicinity of the region in which the plurality of LED chips are provided so that heat generated by the plurality of LED chips 103 can be directly dissipated by the substrate 101, via the die bonding paste.

The fluorescent material-containing resin layer 105 is made of a resin containing a particulate fluorescent material. The fluorescent material-containing resin layer 105 has a dome (hemispheric) shape so as to cover the plurality of LED chips 103, the wiring lines 108, and the region in the vicinity of the region in which the plurality of LED chips 103 are provided (including the main surface of the substrate 101 and a surface of the glass layer 102). The particulate fluorescent material is exemplified by a fluorescent material which, in combination with an emission color of the plurality of LED chips 103, causes the light emitting device 100 to emit light in a predetermined color (chromaticity). Specific examples of the particulate fluorescent material will be described later.

The transmissive resin layer 106 is a no fluorescent material-containing layer which is made of a transmissive silicone resin and contains no fluorescent material. The transmissive resin layer 106 has a dome shape so as to cover the fluorescent material-containing resin layer 105, and is provided so as to cover the main surface of the substrate 101. A domy surface of the transmissive resin layer 106 (spherical surface) serves as a light emitting surface of the light emitting device 100.

The light emitting device 100 having the above arrangement has a width X1 of 2.8 mm, a width Y1 of 2.8 mm, and a height Z1 of 1.9 mm, for example.

(Method for Manufacturing Light Emitting Device)

Next, the following description deals with a method for manufacturing the light emitting device 100 having the above arrangement.

Figure 4:
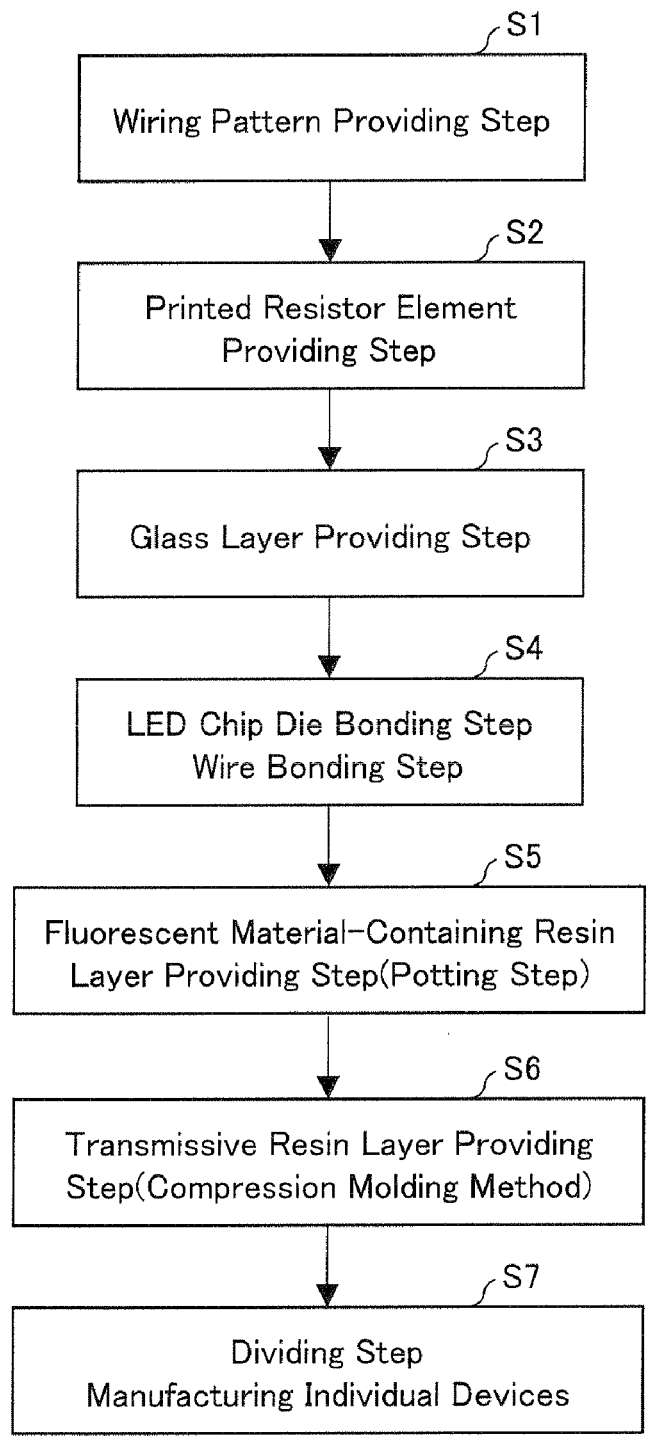
FIG. 4 is a flowchart showing manufacturing steps of the light emitting device.
Figure 6:
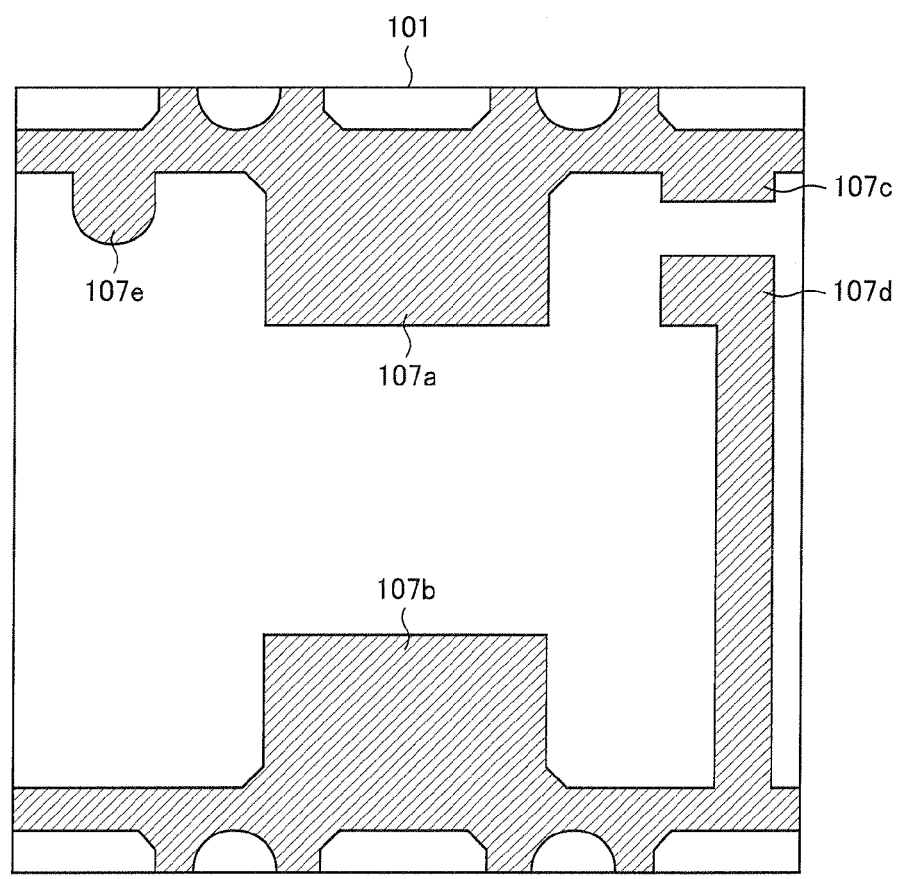
FIG. 6 is a top view illustrating an arrangement of a wiring pattern of the light emitting device.
Figure 7:
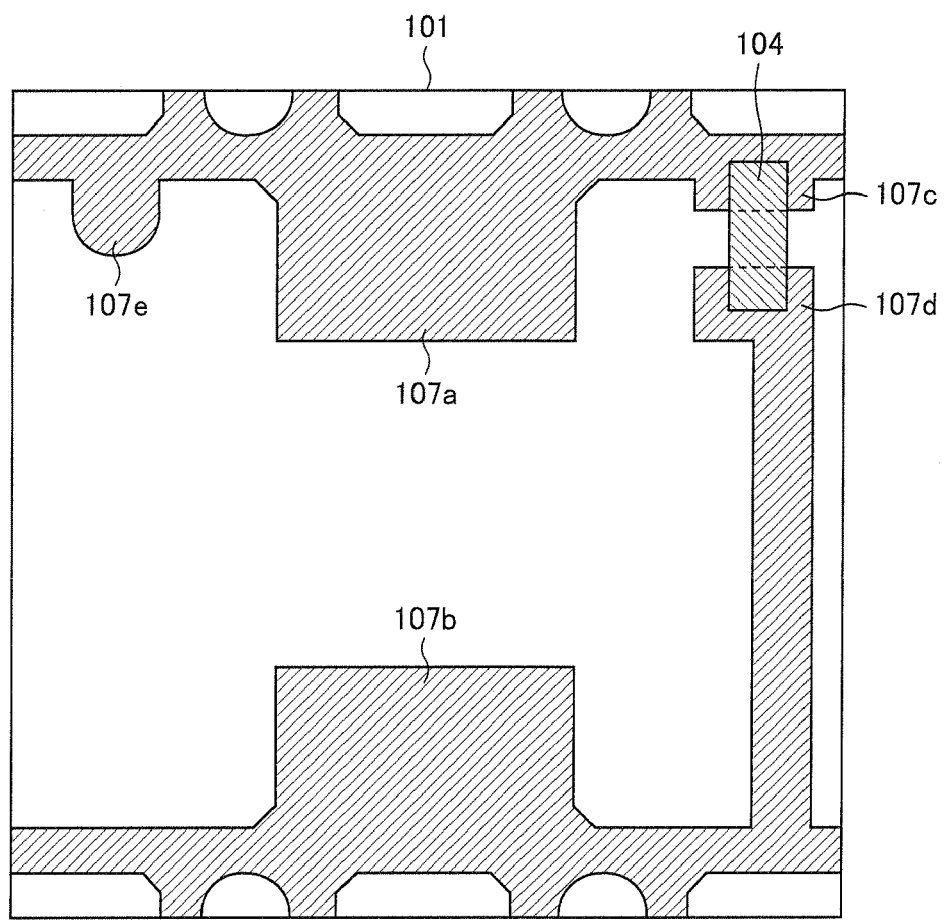
FIG. 7 is a top view illustrating an arrangement of a printed resistor element of the light emitting device.
Figure 8:
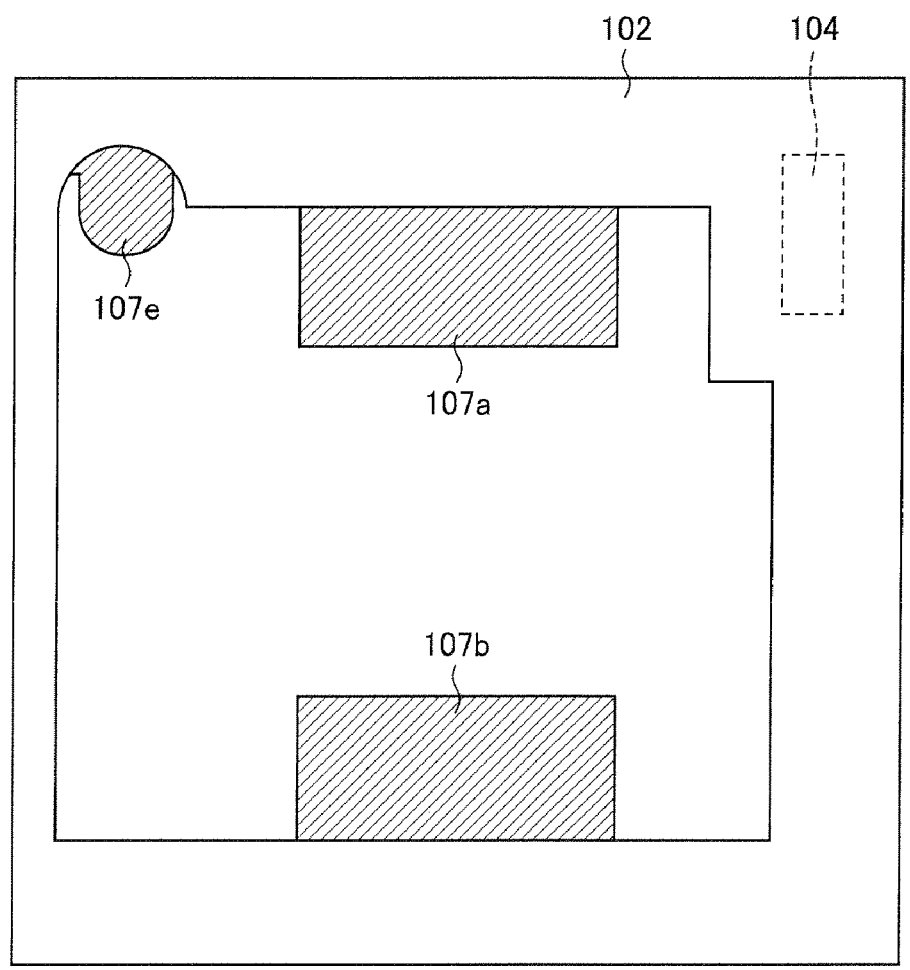
FIG. 8 is a top view illustrating an arrangement of a glass layer of the light emitting device.
Figure 9A:
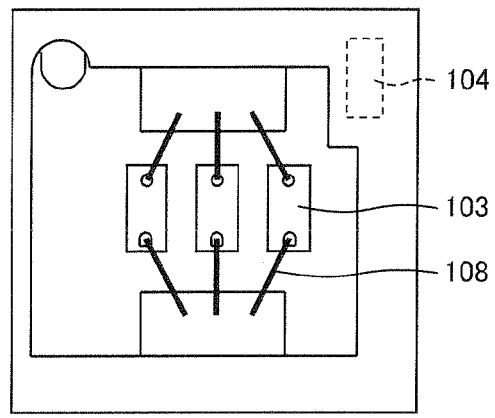
FIG. 9(a) is a top view illustrating an arrangement of LED chips of the light emitting device.
Figure 9B:
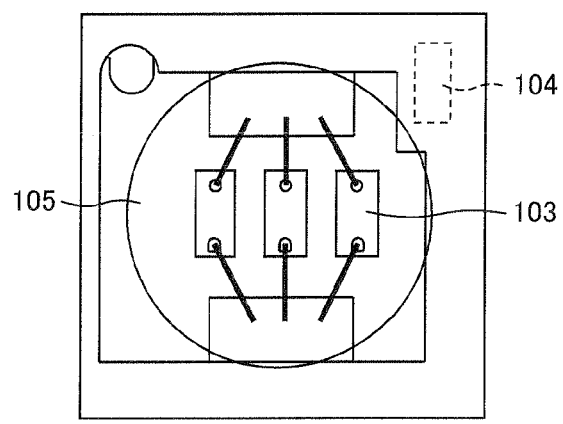
FIG. 9(b) is a top view illustrating an arrangement of a fluorescent material-containing resin layer of the light emitting device.
Figure 9C:
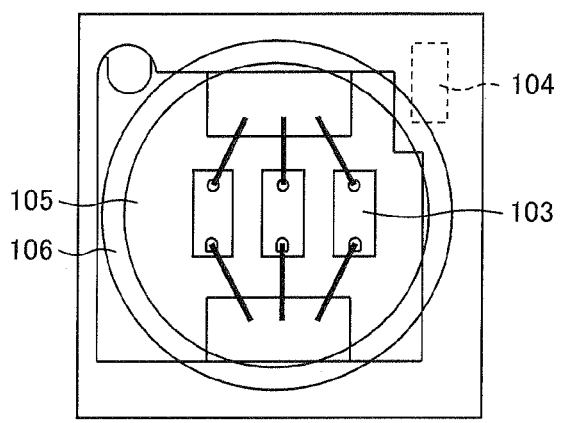
FIG. 9(c) is a top view illustrating an arrangement of a transmissive resin layer of the light emitting device.

FIG. 4 is a flowchart showing how the light emitting device 100 of the present embodiment is manufactured. FIGS. 5(a) through 5(f) are side views which schematically illustrate respective manufacturing steps of the light emitting device 100. FIG. 6 is a top view obtained when the wiring pattern 107 is prepared in one of the manufacturing steps of the light emitting device 100. FIG. 7 is a top view obtained when the printed resistor element 104 is prepared in one of the manufacturing steps of the light emitting device 100. FIG. 8 is a top view obtained when the glass layer 102 is prepared in one of the manufacturing steps of the light emitting device 100. FIG. 9(a) is a top view obtained when the plurality of LED chips 103 are provided and subjected to the wire bonding in one of the manufacturing steps of the light emitting device 100. FIG. 9(b) is a top view obtained when the fluorescent material-containing resin layer 105 is prepared in one of the manufacturing steps of the light emitting device 100. FIG. 9(c) is a top view obtained when the transmissive resin layer 106 is prepared in one of the manufacturing steps of the light emitting device 100.

The method of manufacturing the light emitting device 100 of the present embodiment includes: a wiring pattern providing step (Step S1); a printed resistor element providing step (Step S2); a glass layer providing step (Step S3); an LED chip die bonding step and a wire bonding step (Step S4); a fluorescent material-containing resin layer providing step (Step S5); a transmissive resin layer providing step (Step S6); and a dividing step (Step S7) (see FIG. 4). The following description specifically deals with each of the steps.

Note that the light emitting device 100 is manufactured as follows. (i) a plurality of light emitting devices are integrally prepared, and (ii) the plurality of light emitting devices are subjected to dicing (each of the plurality of light emitting devices is cut out along its four sides (periphery)) so as to be cut into individual light emitting device in the last manufacturing step (Step S7 of the manufacturing steps shown in FIG. 4). The light emitting device 100 is thus prepared. In FIGS. 6 through 8, and FIGS. 9(a) through 9(c), each constituent is illustrated in a simplified but not indefinite manner, as appropriate.

(Step S1: Wiring Pattern Providing Step)

First, the wiring pattern 107 is provided on the main surface of the substrate 101, as illustrated in FIG. 5(a), and FIG. 6. Specifically, the wiring pattern 107 is provided by forming an Ag/Pd pattern (a total thickness of 10 μm) with respect to the main surface of the substrate 101 by a printing method. According to the wiring pattern 107, the cathode electrode 107a, the anode electrode 107b, the electrodes 107c and 107d for the printed resistor, and the cathode mark 107e are provided so as not to extend in the region in which the plurality of LED chips 103 are provided (i.e., so as to extend in the region around the region in which the plurality of LED chips 103 are provided) (see FIG. 6). The cathode electrode 107a and the anode electrode 107b, in particular, are arranged in accordance with where the plurality of LED chips 103 are provided. Further, the electrodes 107c and 107d are arranged in accordance with where the printed resistor element 104 is provided.

Furthermore, the cathode electrode 107a and the anode electrode 107b are subjected to the wire bonding so as to be electrically connected to the plurality of LED chips 103. In a case where the substrate 101 is viewed as illustrated in FIG. 6, each of the cathode electrode 107a and the anode electrode 107b has a horizontal length of 1 mm and a vertical length of 0.45 mm, and a distance between the cathode electrode 107a and the anode electrode 107b is 1.1 mm.

(Step S2: Printed Resistor Element Providing Step)

Next, the printed resistor element 104 is provided, as illustrated in FIG. 5(b), and FIG. 7. Specifically, the printed resistor element 104 is provided in accordance with a manufacturing step, including (1) printing step and (2) baking step, in this order.

In the printing step, a paste containing a resistor component is screen-printed on the Ag/Pd electrodes (on the ends of the respective electrodes 107c and 107d) of the substrate 101. The paste contains a ruthenium oxide ($RuO_2$, ruthenium in a form of conductive particles), a solidifying agent, a resin, and a solvent. The paste is in a form of cream, and has high viscosity. Therefore, the paste maintains its shape even before the baking step, i.e., even immediately after the screen printing step.

Then, in the baking step, the substrate 101 is baked in an electric furnace at 850° C. for 3 hours so that the resistor is fixed. The printed resistor element 104 is thus provided. The printed resistor element 104 has a resistance of 100MΩ, a film thickness in a range of 10 μm to 20 μm, and a width of 0.2 μm×0.65 μm, for example.

It is preferable to use, as the conductive particles contained in the paste, a metal or an oxide, either of which would not be softened at the baking temperature or less. For example, it is preferable to use, as the conductive particles, one or more selected from the group consisting of ruthenium, tin, antimony, zinc, silver, palladium, platinum, gold, nickel, iron, chromium, copper, molybdenum, tungsten, their compounds, and their alloys. Among them, a ruthenium oxide is particularly suitable for being used as the conductive particles. This is because (i), although the ruthenium oxide is an oxide, it exhibits a resistivity of approximately $3 \times 10^{-7}$ Ωm close in value to that of a metal, (ii) it has significantly high thermal stability, and (iii) it can be provided in a form of fine particles.

In the present embodiment, it is necessary to secure a predetermined resistance within dimensions which is determined to some extent by the pattern formation method. On that account, a desired resistivity of the printed resistor element is obtained by (i) selection of the material, (ii) adjustment of an additive(s), and (iii) adjustment of baking condition(s). According to the above example, the resistivity is adjusted to be in the order of $10^{-3}$Ωcm to $10^{-2}$Ωcm.

(Step S3: Glass Layer Providing Step)

Next, the glass layer 102 is provided, as illustrated in FIG. 5(c), and FIG. 8. Specifically, a mold is prepared, which mold has an opening having a shape in accordance with a planar shape of the glass layer 102. Then, the mold is placed in a predetermined position on the main surface of the substrate 101, and a glass material is provided into the opening. Next, an excess of the glass material corresponding to an excess thickness is removed by use of a squeegee. According to the present embodiment, the glass layer 102 has a thickness of 20 μm, for example.

Therefore, the glass material is discharged to regions other than the opening (the printed resistor element 104, the wiring pattern 107 other than the aforementioned regions and components, and the like). The glass layer 102 thus provided has an opening having such a shape that (i) the region in which the plurality of LED chips 103 are provided, (ii) the region in the vicinity of the region in which the plurality of LED chips 103 are provided, (iii) the cathode electrode 107a, (iv) the anode electrode 107b, and (v) the cathode mark 107e are exposed (see FIG. 8).

With the steps, it is possible to manufacture the light emitting device 100 covered with the glass layer 102 having a desired shape.

In the present embodiment, a borosilicate glass, to which an argil (Al—Si) white colorant has been added, was used as the glass layer 102. This causes the glass layer 102 to be milky-white in color. Note that examples of a white pigment to be added to the glass material to prepare a milky-white glass layer 102 encompass: an inorganic pigment such as argils, a titanium oxide, a barium oxide, talc, a barium sulfate, an aluminum hydroxide, silica, mica, a calcium carbonate, a calcium sulfate, and clay; and an organic pigment such as polymer beads. Further, a material containing, for example, a borosilicate glass, a silica glass, a soda-lime glass, an aluminum borosilicate glass, a zinc borosilicate glass, an aluminum silicate glass, or a phosphate glass, can be used as the glass material.

According to the present embodiment, the glass layer 102 has, on the Ag/Pd layer (the wiring pattern 107), a reflectivity of 75% for incident light having a wavelength of 450 nm. Note that an increase in reflectivity of the glass layer 102 causes an increase in difference between heat expansion coefficients of the glass layer 102 and the substrate 101. Further, the increase in reflectivity causes the Ag/Pd of the wiring pattern 107 and the additive of the glass layer 102 to react. This causes a change in the color of the glass layer 102 (into black). Therefore, it is preferable that the reflectivity of the glass layer 102 falls in a range of 70% to 80%.

Particularly, the argils are suitable for being used as the white pigment to be added to the glass material. This is because the argils are light in weight (as compared with a metal), low in heat expansion rate, high in stiffness property, and chemically stable. Further, the borosilicate glass is suitable for being used as the glass material. This is because the borosilicate glass is low in heat expansion rate, high in thermal shock resistance, and high in chemical durability. Note that it is necessary for the solidifying agent to have at least (i) wettabilities with the conductive component and with the substrate 101 and (ii) a heat expansion coefficient close to that of the substrate 101.

(Step S4: LED Chip Die Bonding Step and Wire Bonding Step)

Next, the die bonding of the plurality of LED chips 103 is carried out with respect to the main surface of the substrate 101, and then the wire bonding is carried out so that the electrodes of each of the plurality of LED chips 103 are electrically connected, via their electrodes, between the cathode electrode 107a and anode electrode 107b (see FIG. 5(d), and FIG. 9(a)).

Specifically, the die bonding is carried out, with the use of for example a silicone resin, with respect to three LED chips 103 in predetermined positions on the main surface of the substrate 101 (see FIG. 9(a)). Here, the three LED chips 103 are provided at intervals of 200 μm so as to be electrically connected in parallel with each other.

Next, the wire bonding is carried out with the use of the wiring lines 108. Here, the wire boding is carried out in turn so that the three LED chip 103 are electrically connected to the cathode electrode 107a and the anode electrode 107b of the substrate 101. This allows the arrangement illustrated in FIG. 9(a) to be realized.

(Step S5: Fluorescent Material-Containing Resin Layer Providing Step).

Next, the fluorescent material-containing resin layer 105 is provided, as illustrated in FIG. 5(e) and FIG. 9(b). Specifically, first, a dam sheet 41 is attached to the main surface of the substrate 101, i.e. the surface on which the plurality of LED chips 103 are provided. The dam sheet 41 dams and prevents a fluorescent particles-containing resin (later described) from flowing and spreading out to regions other than a predetermined region, while the fluorescent particles-containing resin is being filled. The dam sheet 41 has a through hole (not illustrated) which can accommodate the LED chips 103. In other words, an outer shape, obtained when viewed from above, of the fluorescent material-containing resin layer 105 is determined by a shape of the through hole of the dam sheet 41 (see FIG. 9(b)).

The dam sheet 41 can be exemplified by a resin sheet, on one surface of which an adhesive is applied, such as Teflon (registered trademark), fluorine-containing rubber, and a silicone sheet. The fluorine-containing rubber is particularly suitable for being used as the dam sheet 41, since it has high elasticity and is easily removed from the substrate 101. Further, it is preferable to select an adhesive that (i) is easily applied to the main surface and (ii) causes no residue of the adhesive to be left on the main surface of the substrate 101 after the dam sheet 41 is removed.

Next, the dam sheet 41 is attached to the substrate 101 so that the three LED chips 103 are accommodated in the through hole. Then, the through hole is filled with the fluorescent particles-containing resin. Note that the fluorescent particles-containing resin is obtained by dispersing the particulate fluorescent material into a liquid silicone resin. In the present embodiment, a red fluorescent material (Sr, Ca) $AlSiN_3$: Eu and a green fluorescent material $Ca_3$ (Sc, Mg)$_2$ $Si_3O1_2$: Ce are used as the particulate fluorescent material.

Note that the present embodiment is not limited to this, and BOSE (Ba, O, Sr, Si, Eu) can be suitably used as the particulate fluorescent material, for example. Instead of the BOSE, SOSE (Sr, Ba, Si, O, Eu), YAG (Ce activated yttrium, aluminum, garnet), a sialon ((Ca), Si, Al, O, N, Eu), β sialon (Si, Al, O, N, Eu), or the like can be suitably used as the particulate fluorescent material.

After the filling of the fluorescent particles-containing resin, the substrate 101 is maintained at 80° C. for 90 minutes. Then, the fluorescent particles-containing resin is cured at 120° C. for 60 minutes. After that, the dam sheet 41 is removed. This allows provision of the fluorescent material-containing resin layer 105 in which the plurality of LED chips 103 and the wiring lines 108 are covered. The fluorescent material-containing resin layer 105 can be provided so as to have a diameter X2 of 2.1 mm, and a height of 1.15 mm from the substrate 101, for example.

Note that it is possible to remove the dam sheet 41 by gripping one end of the dam sheet 41 by use of a jig, and then stripping the dam sheet 41. It is possible to concurrently remove the dam sheet 41 and an excess fluorescent particles-containing resin spilled out of the through hole.

(Step S6: Transmissive Resin Layer Providing Step)

Next, the transmissive resin layer 106 is provided, as illustrated in FIG. 5(f) and FIG. 9(c). Specifically, the transmissive resin layer 106 having a dome shape illustrated in FIG. 5(f) and FIG. 9(c), is provided by use of a compression molding (see FIG. 10).

Figure 10:
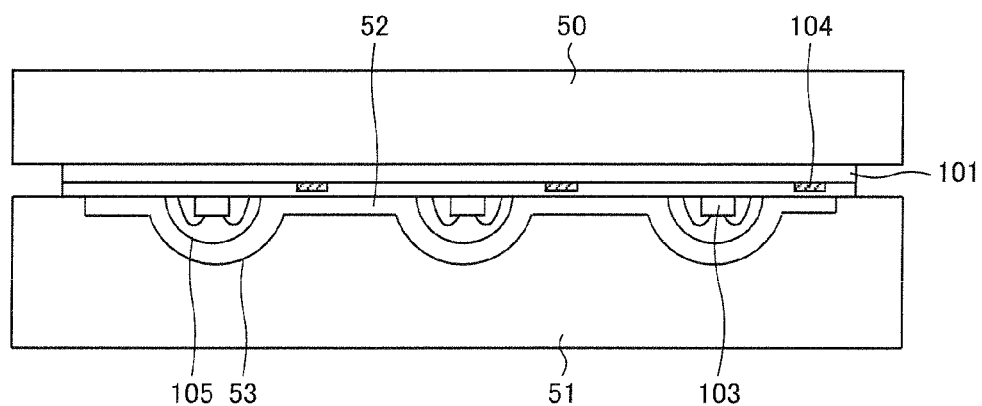
FIG. 10 is a cross-sectional view illustrating a compression molding step for providing the transmissive resin layer of the light emitting device.

The compression molding employs a set of mold constituted by a stationary upper mold 50 and a movable lower mold 51 (see FIG. 10). First, the substrate 101 is placed on a setting part of the stationary upper mold 50 while the fluorescent material-containing resin layer 105 is facing down. Then, small dome cavities (individual cavities) 53 of the movable lower mold 51 are uniformly filled with a necessary liquid resin material (a transmissive silicone resin) having a transparency. The liquid resin material will become the transmissive resin layer 106. Next, the substrate 101 is set on the movable lower mold 51 such that small domes of the fluorescent material-containing resin layer 105 are immersed in the respective small cavities 53. Then, mold clamping is caused by the stationary upper mold 50.

Next, necessary mold clamping force is applied so that the compression molding is carried out as described below. The compression molding is carried out with respect to the stationary upper mold 50 and the movable lower mold 51 by the necessary mold clamping force. This causes the fluorescent material-containing layer 105 to be immersed in the resin in the small cavities 53 which are connected to each other via a large cavity 52. Here, the large cavity 52 functions as a communication path of the transmissive silicone resin. This efficiently prevents inadequate transmissive silicone resin between the small cavities 53, and ultimately allows the transmissive silicone resin to be evenly divided between the small cavities 53.

Then, such a condition is maintained at 150° C. for approximately 1 minute so that the transmissive silicone resin is cured. After that, an after-curing process is carried out at 150° C. for 5 hours. Then the stationary upper mold 50 and the movable lower mold 51 are removed from the substrate 101. This allows (i) the fluorescent material-containing resin layer 105 to be subjected to domy covering and the main surface of the substrate 101 to be evenly covered. In the transmissive resin layer 106, (i) the dome part can have a diameter X3 of 2.4 mm and a height Z2 of 1.3 mm from the substrate 101 and (ii) the even part of the transmissive resin can have a height Z3 of 0.05 mm from the substrate 101, for example.

(Step S7: Dividing Step)

Finally, the plurality of light emitting devices which are integrally prepared are divided into individual light emitting devices 100. The division can be made by carrying out a shearing method in which a cutter cuts above grooves of a rear surface of the substrate 101 from the side on which the transmissive resin layer is provided (from the main surface side). According to the shearing method, the transmissive resin layer 106 is sheared by the cutter, and the substrate 101 is divided along the grooves. This makes it easy for the substrate 101 to be divided.

The individually divided light emitting devices 100 can be thus manufactured. Each of the light emitting devices 100 includes: the substrate 101; the plurality of LED chips 103 provided on the main surface of the substrate 101; and the printed resistor element 104 connected in parallel with the plurality of LED chips 103, the printed resistor element 104 being provided on the main surface. That is, the method for manufacturing the light emitting device 100 includes a step of providing the printed resistor element 104 on the main surface of the substrate 101.

Since the arrangement employs the printed resistor element 104, it has an advantageous effect as compared with an arrangement in which a zener diode (ZD) is employed. The following description deals with such an advantageous effect with reference to FIGS. 11(a) through 11(c).

Figure 11A:
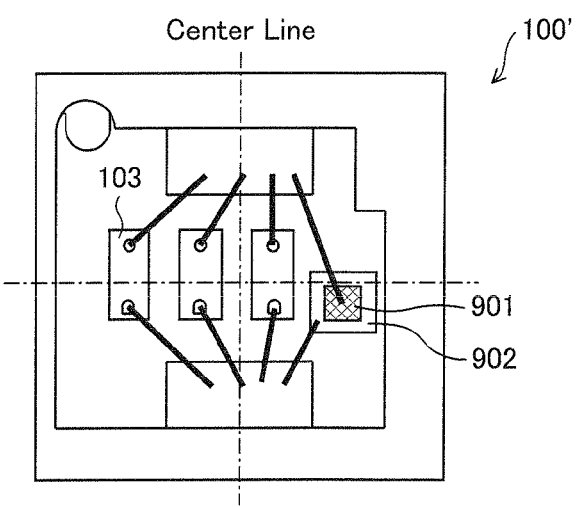
FIG. 11(a) is a top view illustrating, as a comparative example, an arrangement of the light emitting device in which a zener diode is provided in place of the printed resistor element, which zener diode is provided in the fluorescent material-containing resin layer, and is subjected to wire bonding.
Figure 11B:
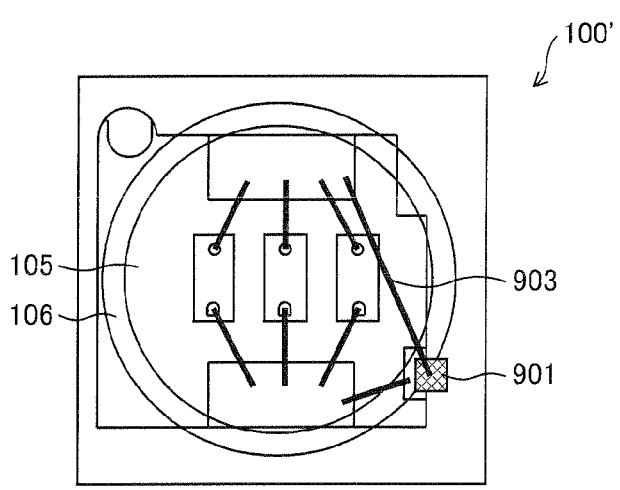
FIG. 11(b) is a top view illustrating, as a comparative example, an arrangement of the light emitting device in which the zener diode is provided in place of the printed resistor element, which zener diode is provided outside the fluorescent material-containing resin layer.
Figure 11C:
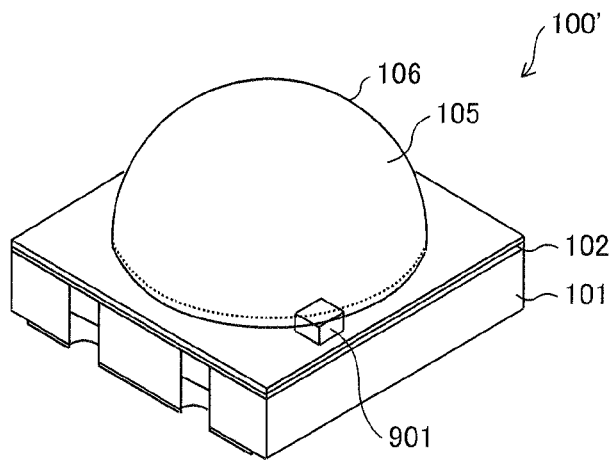
FIG. 11(c) is a perspective view illustrating the light emitting device illustrated in FIG. 11(b).

FIG. 11(a) is a top view illustrating, as a comparative example, an arrangement in which the light emitting device 100 includes a ZD 901 in place of the printed resistor element 104 (hereinafter referred to as "light emitting device 100' "). In FIG. 11(a), the ZD 901 is arranged in the fluorescent material-containing resin layer 105, and is subjected to the wire bonding. FIG. 11(b) is a top view illustrating, as a comparative example, an arrangement in which the light emitting element 100 includes the ZD 901 in place of the printed resistor element 104 (hereinafter referred to as "light emitting device 100' "). In FIG. 11(b), the ZD 901 is provided outside the fluorescent material-containing resin layer 105. FIG. 11(c) is a perspective view illustrating the light emitting device 100' of FIG. 11(b).

In a case where the ZD 901 is provided so as to be subjected to the wire-bonding, it would be impossible to provide the plurality of LED chips 103 in the vicinity of a center of the light emitting device 100' (see FIG. 11(a)). Further, since the ZD 901 is provided on an electrode pad 902 for receiving the ZD 901, a size of the electrode pad 902 should be taken into consideration. For the reasons set forth above, the light emitting device 100' cannot emit light uniformly toward the outside.

If the ZD 901 is provided outside the fluorescent material-containing resin layer 105 (i.e. not in the fluorescent material containing resin 105) so that the LED chips 103 can be provided in the vicinity of the center of the light emitting device 100' (see FIG. 11(b)), then the following problems (1) through (5) will occur.

(1) The wire bonding with respect to the ZD 901 requires provision of the ZD 901 in the vicinity of the LED chips 103. Therefore, it is necessary to provide the ZD 901 in the fluorescent material-containing resin layer 105. This, however, will cause a reduction in luminance (optical output) due to optical absorption by the ZD 901. For this reason, it is impossible to provide the ZD 901 in the fluorescent material-containing resin layer 105.

(2) The fluorescent material-containing resin layer 105 is generally provided by use of the dam sheet 41 (or a resin dam). In a case where the ZD 901 having a certain height (for example, a height of 85 μm) is provided outside the region in which the fluorescent material-containing resin layer 105 is provided, there will occur a reduction in adhesion of the dam sheet 41 with respect to the substrate 101, which will cause leakage of the resin. This may ultimately cause the ZD 901 to be broken down. For the reasons set forth above, it becomes impossible to provide the fluorescent material-containing resin layer 105 with the use of the dam sheet 41.

(3) It is impossible to provide the ZD 901 between the fluorescent material-containing resin layer 105 and the transmissive resin layer 106 due to a narrow space (gap) (0.15 mm in the present embodiment) between them.

(4) If, nevertheless, the ZD 901 is provided in such a narrow space between the fluorescent material-containing resin 105 and the transmissive resin layer 106, then there will cause a problem that the transmissive resin layer 106 cannot be provided so as to have a steady dome shape.

(5) There will cause a problem that it becomes more difficult to provide the transmissive resin layer 106 so as to have a steady dome shape as the ZD 901 is provided closer to a corner of the light emitting device 100'. That is, a height of the ZD 901 becomes an obstacle to the provision of the ZD 901 in the corner of the light emitting device 100', during the compression molding step of the transmissive resin layer 106.

On the other hand, according to the arrangement of the light emitting device 100 of the present embodiment, the use of the printed resistor element 104 eliminates such a limitation on layout. Accordingly, it becomes possible to provide the printed resistor element 104 so that (i) the printed resistor element 104 is provided outside the fluorescent material-containing resin layer 105 and (ii) the transmissive resin layer 106 is provided above a part of the printed resistor element 104 (see FIG. 9(c)).

Further, since the printed resistor element 104 has a thin film shape, the fluorescent material-containing resin layer 105 can be provided easily and stably by use of the dam sheet 41. This allows a reduction in the risk of leakage of the resin in the step of providing the fluorescent material-containing resin layer 105.

Moreover, since the printed resistor element 104 has a thin film shape and does not have any limitations on its layout, it becomes possible for the printed resistor element 104 to be easily covered with a milky white glass layer 102. This causes a reduction in optical shielding and optical absorption, by the printed resistor element 104, of the light emitted from the plurality of LED chips 103.

Figure 12:
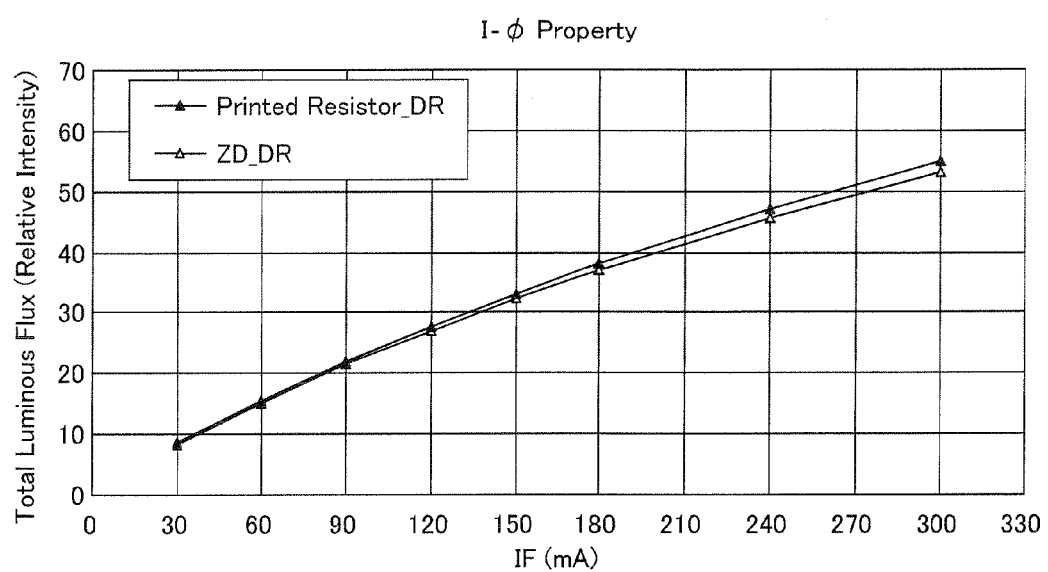
FIG. 12 is a graph showing a comparison between the light emitting device including the printed resistor element of the present embodiment and the light emitting device of a comparative example including the zener diode, in terms of how total luminous flux changes in response to a drive current (IF).

FIG. 12 shows a comparison between the light emitting device 100 of the present embodiment including the printed resistor element 104 and the light emitting device 100' of the comparative example including the ZD 901, in terms of how total luminous flux changes in response to a driving current (IF). In FIG. 12, a lateral axis indicates the driving current (mA), and a vertical axis indicates the total luminous flux (relative intensity).

As is clear from FIG. 12, the light emitting device 100 including the printed resistor element 104 is greater in total luminous flux, i.e. light intensity, than the light emitting device 100' including the ZD 901. Particularly, a difference in the total luminous flux between the light emitting devices 100 and 100' becomes greater as the driving current becomes greater.

Therefore, the light emitting device 100 including the printed resistor element 104 can emit light having preferable luminance without a reduction in optical output while suppressing optical shielding and optical absorption of the light emitted from the LED chips 103 toward the outside. Further, it is possible to manufacture the light emitting device 100 at low cost.

Furthermore, the light emitting device 100 thus manufactured allows an improvement in yield, and allows realization of a double-sealed LED having high reliability.

In a case where (i) a plurality of light emitting devices 100 constitute a closed-loop circuit while a light emitting module, including the plurality of light emitting devices 100, is turning off and (ii) the light emitting module is used in a situation in which outside light is always incident on a part of the plurality of light emitting devices 100, the plurality of LED chips 103 have photo-electromotive force. The photo-electromotive force may cause the plurality of LED chips 103 to be deteriorated.

In a light emitting module in which (i) a plurality of light emitting devices each including a plurality of LED chips are provided and (ii) a resistor is employed instead of a zener diode, the inventors of the present invention found, as a result of experiments and study, the following phenomenon: in a case where the plurality of light emitting devices constitute a closed-loop circuit while the plurality of light emitting devices are in an off-state in which the plurality of light emitting devices receive no power (while a switch via which the power is applied is being shut off), if outside light is incident on some of the plurality of light emitting devices, then photo-electromotive force is generated in a plurality of LED chips in the some of the plurality of light emitting devices; this causes reverse bias to be statically applied to a plurality of LED chips in each of the other ones of the plurality of light emitting devices; and the plurality of LED chips in each of the other ones of the plurality of light emitting devices are deteriorated.

Meanwhile, according to the light emitting device 100 of the present embodiment, the printed resistor element 104 is connected in parallel with the plurality of LED chips 103 provided in the light emitting device 100. This can prevent the deterioration of the plurality of LED chips 103 due to the photo-electromotive force. Further, this can also be a measure against surge. The light emitting device 100 is given a longer life, and it is therefore possible to ensure reliability of the light emitting device 100.

Accordingly, in order to (i) prevent break-down of an LED chip 103 due to surge and (ii) have a measure against the deterioration of the LED chip 103 due to the photo-electromotive force, it is preferable that the printed resistor element 104 has a resistance less than that of a resistance component of an impedance obtained when a reverse bias is applied to the LED chip 103. Namely, the resistance is desirably 10 GΩ or less. Further, the printed resistor element 104 should have a resistance of 150 kΩ or more so that a leakage current, which flows the printed resistor element 104 when forward bias is applied to the LED chip 103, does not affect a driving current for the LED chip 103. However, it is preferable that the printed resistor element 104 has a resistance of 1 MΩ or more, in a case where the leakage current is suppressed to such a degree that it becomes possible to find any real defective product in an inspection step of finding a defective product by measuring a forward voltage in a micro region, which inspection step is carried out after the light emitting device is completed.

According to the light emitting device 100 described above, the printed resistor element 104 is provided on the main surface of the substrate 101. Note, however, that the present embodiment is not limited to this. The printed resistor element 104 has no limitation on its layout, and therefore can be provided (formed) on the main surface, a back surface (a surface opposite to the main surface) of the substrate 101, or inside the substrate 101. For example, it is possible to (i) adopt a substrate 101, made of ceramics, having a multilayer structure, (ii) provide, inside the substrate 101, through hole electrodes electrically connected to the cathode electrode 107a and the anode electrode 107b, and (iii) the printed resistor element 104 is provided on a multilayer interface of the substrate 101. Instead, it is also possible to (i) select a plurality of positions out of (a) a position on the main surface of the substrate 101, (b) a position on the back surface of the substrate 101, and (c) a position inside the substrate 101, and (ii) provide a plurality of the printed resistor elements 104 in the respective positions thus selected.

Moreover, the number of the LED chips 103 and the number of the printed resistor elements 104 are not limited to those described above. It is possible to provide either a single LED chip 103 or a plurality of LED chips 103, and it is possible to provide either a single printed resistor element 104 or a plurality of printed resistor elements 104. It is also possible to provide a single printed resistor element 104 either in parallel with a single LED chip 103 or in parallel with a plurality of LED chips 103.

Further, according to the light emitting device 100 described above, the printed resistor element 104 is covered by the glass layer 102. However, the present embodiment is not limited to this, and the material for covering the printed resistor element 104 may be a white solder resist. That is, it is possible to have an arrangement in which no glass layer 102 is provided. In this case, the printed resistor element 104 is covered by the white solder resist, while the wiring pattern 107 is covered by the (white) solder resist.

[Embodiment 2]

According to the light emitting device 100 of Embodiment 1, the plurality of LED chips are doubly sealed with the fluorescent material-containing resin layer 105 and the transmissive resin layer 106. However, the present invention is not limited to this, and the plurality of LED chips can be sealed with at least one of the fluorescent material-containing resin layer 105 and the transmissive resin layer 106. That is, the sealing resin can be selected in accordance with a sort of LED chip 103 and/or a design of an emission color.

Figure 13:
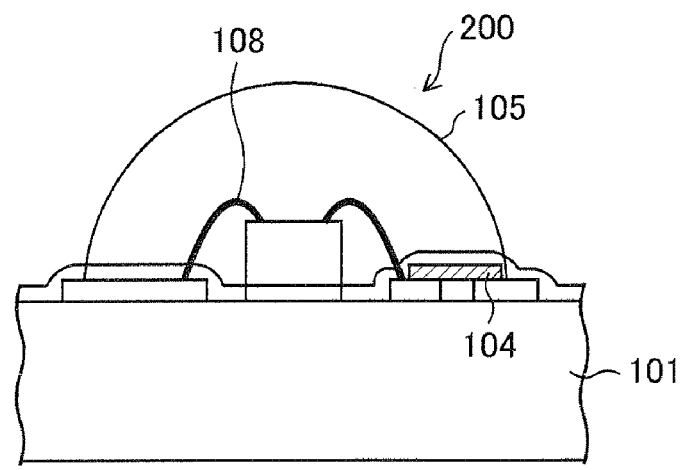
FIG. 13(a) is a cross-sectional view illustrating a light emitting device in accordance with another embodiment.
FIG. 13(b) is a perspective view of FIG. 13(a), obtained in a case where the light emitting device is viewed from above.
Figure 13:
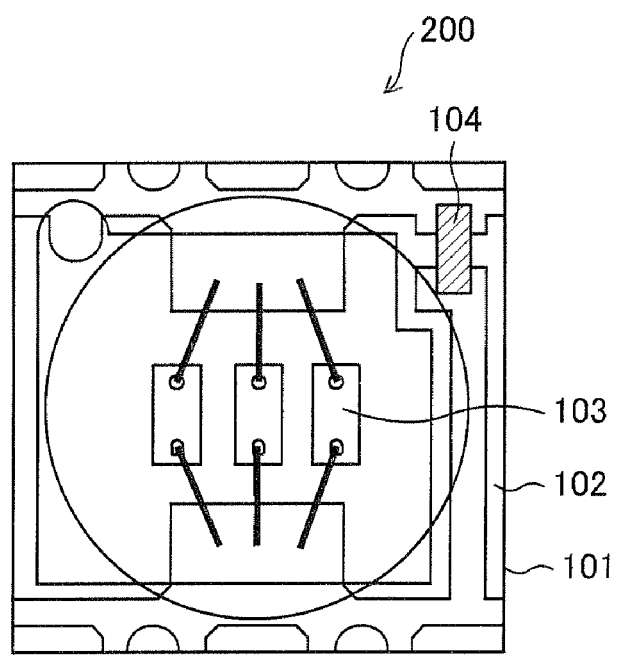

FIG. 13(*a*) is a cross-sectional view illustrating an example of an arrangement of a light emitting device 200 of the present embodiment. FIG. 13(*b*) is a perspective view obtained in a case where the light emitting device 200 is viewed from above. The light emitting device 200 has an arrangement in which no transmissive resin layer 106 is provided in the light emitting device 100 of Embodiment 1 (see FIGS. 13(*a*) and 13(*b*)).

In the light emitting device 200, the printed resistor element 104 is provided in the vicinity of a periphery of the fluorescent material-containing resin layer 105. However, it is possible to provide, by use of a dam sheet 41 (see the above descriptions), the fluorescent material-containing resin layer 105 having a desirable dome shape without a reduction in optical output. Note that in a case where only the transmissive resin layer 106 is provided, it is possible to provide the transmissive resin layer 106 in a similar manner to the fluorescent material-containing resin layer 105, that is, by use of the dam sheet 41.

Here, for example, the plurality of LED chips 103 can be made up of (i) a plurality of light emitting elements, i.e., red, green, and blue light emitting elements or plurality of blue light emitting elements.

[Embodiment 3]

According to the light emitting device 100 of Embodiment 1, each of the fluorescent material-containing resin layer 105 and the transmissive resin layer 106 has a dome shape. However, the present invention is not limited to this, provided that each of the fluorescent material-containing resin layer 105 and the transmissive resin layer 106 has a shape which allows the light emitted from the plurality of LED chips 103 to uniformly outgo to the outside from the entire surface on which LED chips 103 are provided.

Figure 14A:
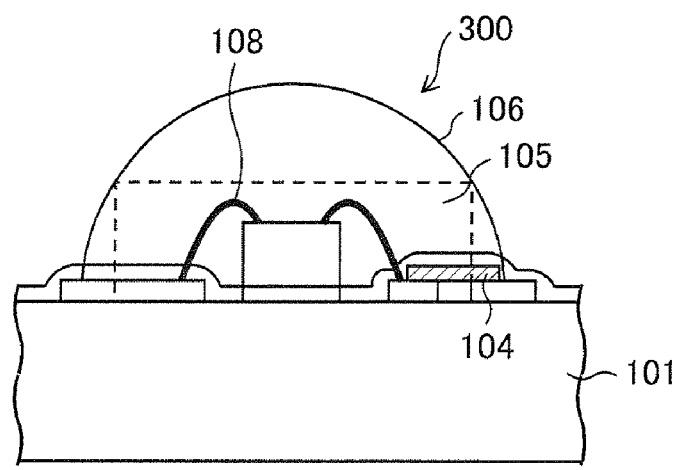
FIG. 14(a) is a cross-sectional view illustrating a light emitting device in accordance with still another embodiment.
Figure 14B:
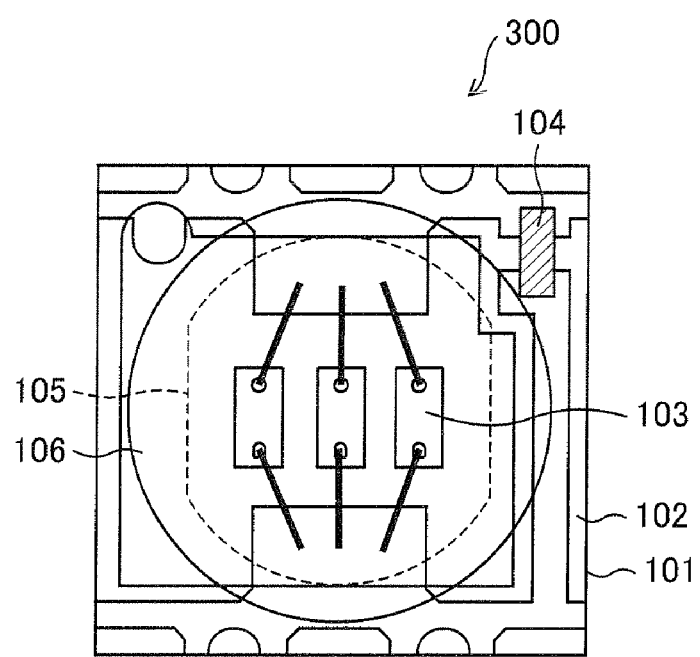
FIG. 14(b) is a perspective view of FIG. 14(a), obtained in a case where the light emitting device is viewed from above.

FIG. 14(a) is a cross-sectional view illustrating an example of an arrangement of a light emitting device 300 of the present embodiment. FIG. 14(b) is a perspective view obtained in a case where the light emitting device 300 is viewed from above. The light emitting device 300 has an arrangement similar to that of the light emitting device 100 of Embodiment 1, except for a shape of the fluorescent material-containing resin layer 105 (see FIGS. 14(a) and 14(b)).

According to the light emitting device 300, the fluorescent material-containing resin layer 105 has a rectangular shape when viewed from side (has a flat top surface) (see FIG. 14(a)). Meanwhile, the fluorescent material-containing resin layer 105 has a shape in which two sides facing each other are respective straight lines in parallel when viewed from above, and the other two sides are respectively excurved when viewed from above (see FIG. 14(b)). The fluorescent material-containing resin layer 105 has a height of 0.385 mm, for example. The printed resistor element 104 is provided in the vicinity of a periphery of the transmissive resin layer 106 which covers the fluorescent material-containing resin layer 105.

According to the light emitting device 300, the printed resistor element 104 is provided in the vicinity of the periphery of the transmissive resin layer 106, i.e., in a corner of a main surface of a substrate 101. However, the printed resistor element 104 does not cause a bad influence on a compression molding step of the transmissive resin layer 106, since the printed resistor element 104 has a thin film shape, and is covered with a glass layer 102. Therefore, the printed resistor element 104 can be provided in the vicinity of the periphery of the transmissive resin layer 106 or in a corner of the main surface of the substrate 101.

[Embodiment 4]

The following description deals with still a further embodiment with reference to drawings. Note that arrangements other than the following arrangement are the same as those of Embodiments 1 through 3. For convenience, members having the same functions as the members illustrated in the drawings used in Embodiments 1 through 3 have the same signs, and explanations of these are omitted here.

Figure 15A:
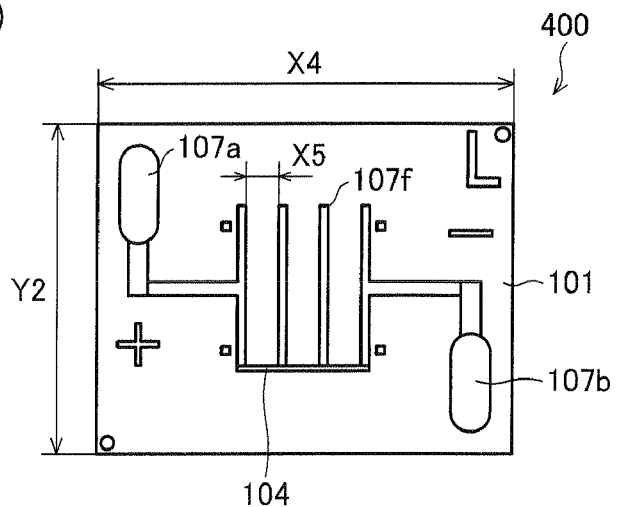
FIG. 15(a) is a top view illustrating a light emitting device in accordance with further another embodiment in which LED chips are not provided.
Figure 15B:
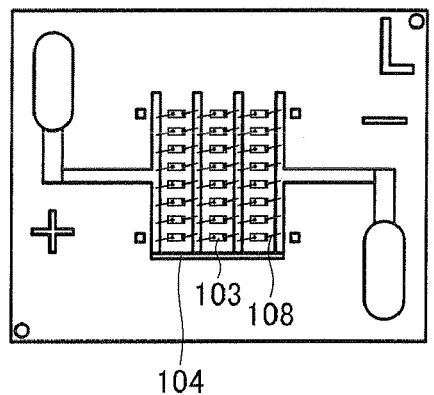
FIG. 15(b) is a top view of FIG. 15(a), in which the LED chips are provided.
Figure 15C:
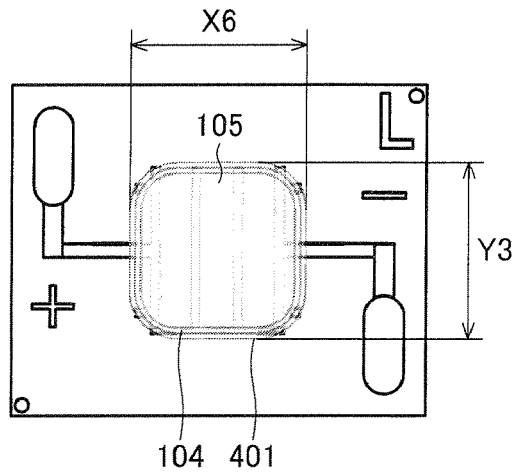
FIG. 15(c) is a top view of FIG. 15(a), in which the fluorescent material-containing resin layer is provided.

FIG. 15(a) is a top view illustrating an example of how a light emitting device 400 of the present embodiment is arranged before a plurality of LED chips 103 are provided. FIG. 15(b) is a top view illustrating how the light emitting device 400 is arranged when the plurality of LED chips 103 are provided. FIG. 15(c) is a top view illustrating how the light emitting device 400 is arranged when a fluorescent material-containing resin layer 105 is provided.

The light emitting device 400 includes: a substrate 101; a glass layer 102; the plurality of LED chips 103 (24 blue LEDs); a printed resistor element 104; the fluorescent material-containing resin layer 105; and a resin ring 401 (resin ring member) (see FIGS. 15(a) through 15(c)).

The plurality of LED chips 103 are provided on the main surface of the substrate 101 in 3 lines (8 LEDs 103 per line). An electrode pattern 107f, which corresponds to a wiring pattern 107, is provided on the substrate 101 in accordance with how the plurality of LED chips 103 are provided. The electrode pattern 107f is provided so as to (i) electrically connect a cathode electrode 107a to corresponding electrodes of the plurality of LED chips 103 and (ii) electrically connect an anode electrode 107b to corresponding electrodes of the plurality of LED chips 103, the cathode electrode 107a and the anode electrode 107b being provided in respective opposite corners on the main surface of the substrate 101.

The substrate 101 has a size of X4 (=15 mm) and Y2 (=12 mm), and a thickness of 1 mm, for example. The electrode pattern 107f is made of gold (Au), and has a pattern width of 0.3 mm with intervals X5 (=1.2 mm). The printed resistor element 104 has a resistance of 1MΩ, and a width of 0.2 mm. Further, each of the cathode electrode 107a and the anode electrode 107b has a diameter of 1.4 mm, and has a straight line part of 2.12 mm.

The resin ring 401 is a ring member made of a white resin. The resin ring 401 is a so-called resin dam which is the same in material and usage as those of a dam sheet 41 of Embodiment 1. The resin ring 401 has a ring width of 0.4 mm, and ring intervals of 6 mm, for example. That is, the fluorescent material-containing resin layer 105 has a size of X6 (=6 mm) and Y3 (=6 mm) when viewed from above.

In the light emitting device 400, the printed resistor element 104 is provided below the resin ring 401. This can suppress optical absorption by the printed resistor element 104 more greatly. Further, this protects an upper surface (a surface and the like) of the printed resistor element 104. Furthermore, this also makes it possible to manufacture a compact light emitting device 400 in spite of including the printed resistor element 104.

[Embodiment 5]

The following description deals with yet another embodiment with reference to drawings. Note that arrangements other than the following arrangement are the same as those of Embodiments 1 through 4. Further, members having the same functions as the members illustrated in the drawings used in Embodiments 1 through 4 have the same signs, and their descriptions are omitted here, for convenience.

Figure 16A:
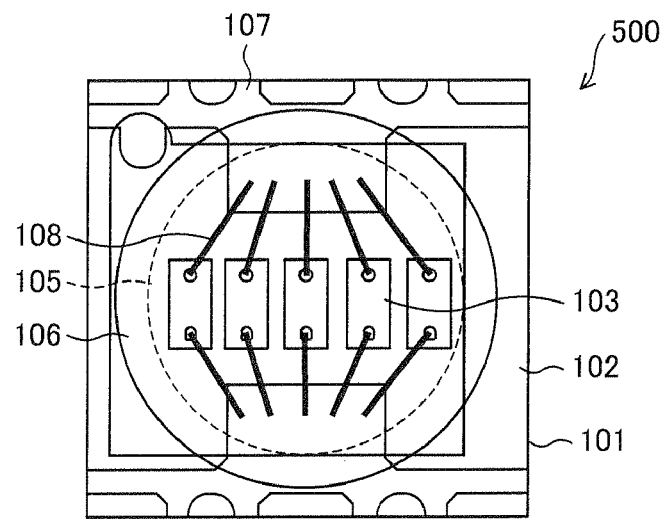
FIG. 16(a) is a perspective view illustrating a light emitting device in accordance with yet another embodiment obtained in a case where the light emitting device is viewed from above.
Figure 16B:
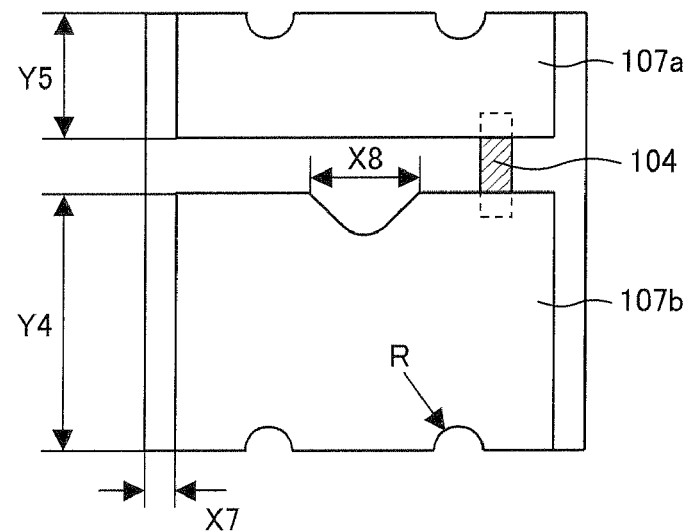
FIG. 16(b) is a backside view illustrating the light emitting device illustrated in FIG. 16(a).

FIG. 16(a) is a perspective view illustrating an example of an arrangement of a light emitting device 500 of the present embodiment, obtained in a case where the light emitting device 500 is viewed from above. FIG. 16(b) is a view illustrating a back surface of the light emitting device 500.

The light emitting device 500 includes: a substrate 101; a glass layer 102; a plurality of LED chips 103 (5 blue LEDs); a printed resistor element 104; a fluorescent material-containing resin layer 105; and a transmissive resin layer 106 (see FIGS. 16(a) and 16(b)). According to the light emitting device 500, a cathode electrode 107a and an anode electrode 107b are provided on the back surface, and the printed resistor element 104 is provided on the back surface of the substrate 101.

The printed resistor element 104 is provided before the provision of the cathode electrode 107a and the anode electrode 107b. After the printed resistor element 104 is provided, the cathode electrode 107a and the anode electrode 107b are provided so as to cover respective ends of the printed resistor element 104. This causes the printed resistor 104 to be provided between the cathode electrode 107a and the anode electrode 107b. Note that each of the cathode electrode 107a and the anode electrode 107b is provided so as to extend from a main surface of the substrate 101 to the back surface, via a side surface of the substrate 101.

On the back surface of the substrate 101, the cathode electrode 107a is provided in a region defined by a length Y5 (=0.8 mm) and a length X7 (=0.2 mm), and the anode electrode 107b is provided in a region defined by the length X7, a length X8 (=0.7 mm), and a length Y4 (=1.65 mm), for example (see FIG. 16(b)).

According to the light emitting device 500, the printed resistor element 104 is provided on the back surface of the substrate 101. This allows a region on the main surface of the substrate 101, in which region the LED chips 103 can be provided, to be larger. The arrangement allows 5 LED chips 103 to be provided, for example. Therefore, it becomes possible to manufacture a brighter LED thus doubly sealed.

Note that a wax material part will be generated in a case where a wax material gets wet so as to connect the cathode electrode 107a with the anode electrode 107b and therefore the wax material is electrically connected in parallel with the printed resistor element 104. In a case where the printed resistor element 104 is made from the material described in Embodiment 1, a wax material does not get wet. Therefore, even if the light emitting device 500 is provided on a mounting substrate, no wax material part will never be generated on the printed resistor element 104. However, in a case where the printed resistor element 104 is made from a material that causes the wax material to get wet, it is necessary to take measures such as covering the printed resistor element 104 with an insulating layer such as a dry film or a glass layer.

[Embodiment 6]

The following description deals with yet still another embodiment of the present invention with reference to drawings. Note that arrangements other than the following arrangement are the same as those of Embodiments 1 through 5. For convenience, members having the same functions as the members illustrated in the drawings used in Embodiments 1 through 5 have the same signs, and their descriptions are omitted here.

Figure 17A:
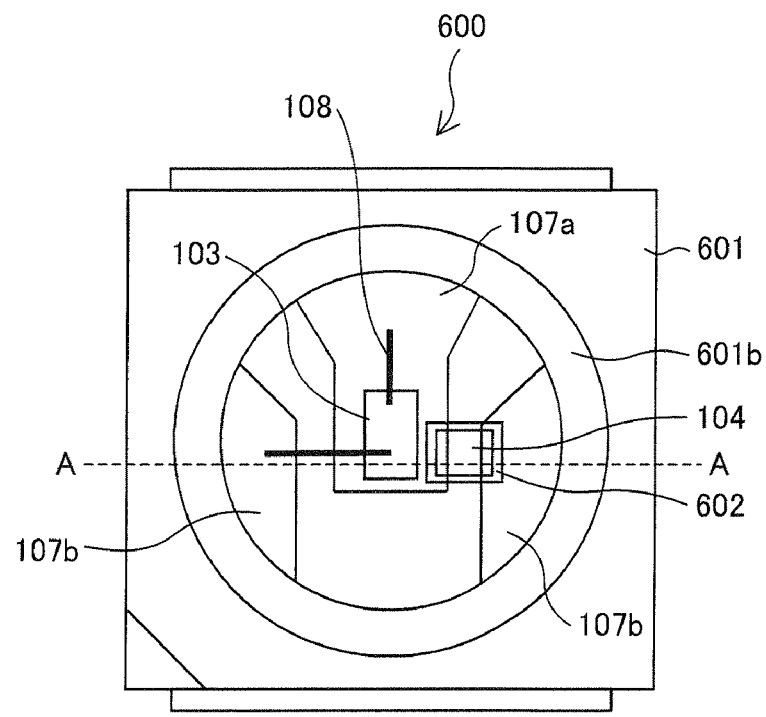
FIG. 17(a) is a top view illustrating a light emitting device in accordance with yet still another embodiment.
Figure 17B:
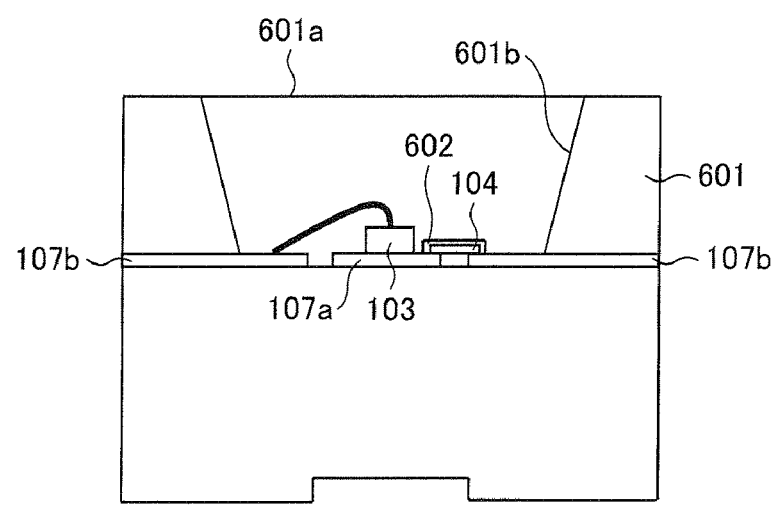
FIG. 17(b) is a cross-sectional view of FIG. 17(a), taken along the line A-A.

FIG. 17(a) is a top view illustrating an example of an arrangement of a light emitting device 600 of the present embodiment. FIG. 17(b) is a cross-sectional view illustrating the light emitting device 600 of FIG. 17(a), taken along the line A-A.

The light emitting device 600 of the present embodiment is a small-package LED light emitting device having a transmissive surface for emitting light toward the outside, the transmissive surface having an approximate circular shape. The light emitting device 600 includes a polyphthalamide (PPA) substrate 601 (substrate), an LED chip 103, and a printed resistor element 104 (see FIGS. 17(a) and 17(b)). In the light emitting device 600, an inside of a depression opening portion 601a of the PPA substrate 601 is filled with a fluorescent material and a sealing resin (which correspond to a fluorescent material-containing resin layer 105). Note, however, that neither any fluorescent material nor any sealing resin is illustrated in each of FIGS. 17(a) and 17(b) for the sake of detailed illustration of the inside of the depression opening portion 601a.

The depression opening portion 601a is a recessed part of an upper surface (light emitting surface) of the PPA substrate 601, and has a side wall which serves as a light reflection wall 601b. The light reflection wall 601b is provided to surround the LED chip 103, while inclining to be narrower as being closer to a bottom side from an upper side. A cathode electrode 107a and an anode electrode 107b are provided on a bottom surface of the depression opening portion 601a. Each of the cathode electrode 107a and the anode electrode 107b extends to the outside of the PPA substrate 601 so as to be connected to an external power source of the light emitting device 600.

The printed resistor element 104 is covered with a solder resist (light reflecting member) 602 for reflecting light. Further, the LED chip 103 is surrounded by the light reflecting wall 601b. Therefore the light emitted from the LED chip 103 can be successfully reflected by the light reflecting wall 601b without being absorbed by the printed resistor element 104. Accordingly, it is possible to increase an amount of light emitted to the outside of the light emitting device 600.

The light emitting device 600 having the above arrangement can be manufactured as described below. First, a lead frame (wiring pattern 107) is made by punching or the like. Then the lead frame is placed on a base for applying a printed resistor paste. Next, the printed resistor paste pattern (the printed resistor element 104) is provided on the base by screen printing or the like. The predetermined cathode electrode 107a and the predetermined anode electrode 107b, which are spatially separated from each other, are connected to each other via the printed resistor paste pattern. Here, the printed resistor paste is in a form of cream, and has high viscosity. For this reason, the printed resistor paste does not lose its shape even before a baking step, i.e. even immediately after the screen printing step.

Then, a printed resistor paste pattern is baked as the lead frame is kept on the base. The printed resistor element 104 is thus made stable. After that, the lead frame on which the printed resistor element 104 is provided is separated from the base, and the PPA substrate 601 is provided around the lead frame by use of a transfer mold or the like. Then, an LED chip die bonding step, a wire bonding step, a sealing resin providing step, and a dividing step are carried out as shown in the steps S4 through S7 of FIG. 4. The light emitting device 600 is thus manufactured.

As described above, even if the region in which the LED chip 103, (i.e. the surface on which LED chip 103 is provided) is provided is surrounded by the light reflecting wall 601b of the PPA substrate 601, the printed resistor element 104 can be provided in the vicinity of the LED chip 103.

Further, the printed resistor element 104 is covered with the solder resist 602. This can suppress optical absorption, by the printed resistor element 104, of the light emitted from the LED chip 103. That is, it is possible to achieve the same effect as with the printed resistor element 104 covered by a glass layer 102. Note that it is preferable for the solder resist 602 to be milky white in color. This can increase the effect of suppressing optical absorption.

Furthermore, according to the light emitting device 600, a single LED chip 103 and a single printed resistor element 104 are provided. Note, however, that, as a matter of course, it is possible to provide a plurality of LED chips 103, and/or a plurality of printed resistor elements 104.

Moreover, it is also possible to provide (i) the lead frame in such a shape that a cathode-side part of the lead frame (cathode electrode 107a) and an anode-side part of the lead frame (anode electrode 107b) are provided inside the PPA substrate 601, and (ii) the printed resistor element 104 inside the PA substrate 601 so as to connect the cathode-side part and the anode-side part to each other.

Further, it is also possible that the cathode-side lead frame and the anode-side lead frame are provided to be exposed on the back surface of the PPA substrate 601, and the printed resistor element 104 is provided on the back surface of the PPA substrate 601, like the light emitting device 500 of Embodiment 5.

Instead, it is also possible to cause an outer part of the lead frame, which is to be connected to the mounting substrate, to (i) extend up to a side surface of the PPA substrate 601 instead of extending up to the back surface, and (ii) to be bended along the side surface. With this arrangement, the side surface is connected to the mounting substrate. In this case, it becomes unnecessary to take into consideration wettability of the printed resistor element 104. Therefore, selectability of the material of the printed resistor element 104 can be increased.

Finally, in any of Embodiments 1 through 6, the printed resistor element 104 may be provided on a submount inserted between the LED chip 103 and the substrate 101. That is, the printed resistor element 104 can be provided between the LED chip 103 and the substrate 101. With this arrangement, it becomes possible to (i) have an increase in heat dissipation of the LED chip 103, and (ii) use an LED chip 103 of a flip-chip type.

Further, a surface light source can be realized as a module manufactured by (i) appropriately selecting light emitting devices from among the light emitting devices 100, 200, 300, 400, 500, and/or 600, and (ii) providing the selected light emitting devices on the mounting substrate, and (iii) electrically connecting the selected light emitting devices to each other in series, in parallel, or in series parallel. Accordingly, it is possible to realize a surface light source which is hardly affected by surge, without an increase in power consumption and a decrease in luminance.

The present technology is not limited to the description of the embodiments above, but may be altered by a skilled person within the scope of the claims. An embodiment based on a proper combination of technical means disclosed in different embodiments is encompassed in the technical scope of the present technology.

A light emitting device of the present embodiments includes: a substrate; a semiconductor light emitting element provided on a main surface of the substrate; and a protective element connected in parallel with the semiconductor light emitting element, the protective element being a printed resistor provided in at least one of regions (i) on the main surface of the substrate, (ii) on a back surface of the substrate, and (iii) inside the substrate.

Further, in the light emitting device of the present embodiments, the semiconductor light emitting element is preferably covered with a fluorescent material-containing resin layer or a transmissive resin layer, each provided on the main surface of the substrate, the fluorescent material-containing resin layer being made of a resin containing a fluorescent material, the transmissive resin layer being made of a transmissive resin; and the protective element is preferably provided on the main surface and outside the fluorescent material-containing resin layer or the transmissive resin layer.

According to the arrangement, the protective element is a printed resistor having a thin film shape. Therefore, even if the protective element is provided on the main surface, it is possible to provide, by use of a dam sheet (a resin dam) or the like, the fluorescent material-containing resin layer or the transmissive resin layer stably and easily. Further, this can also reduce a risk of leakage of a resin in a step of providing the fluorescent material-containing resin layer or in a step of providing the transmissive resin layer.

Note that the fluorescent material-containing resin layer or the transmissive resin layer preferably has a dome shape so that the light emitted from the semiconductor light emitting element is caused to uniformly outgo to the outside from the entire main surface.

Further, in the light emitting device of the present embodiments, the semiconductor light emitting element is preferably covered with, via a fluorescent material-containing resin layer made of a resin containing a fluorescent material, a transmissive resin layer made of a transmissive resin, the fluorescent material-containing resin layer and the transmissive resin layer being provided on the main surface of the substrate; and the protective element is preferably provided on the main surface of the substrate and outside the transmissive resin layer. Further, the transmissive resin layer preferably has a dome shape.

According to the arrangement, it becomes possible to (i) provide, by use of the dam sheet or the like, the fluorescent material-containing resin layer and the transmissive resin layer stably and easily, and (ii) realize a light emitting device which is doubly sealed and has high reliability.

Further, in the light emitting device of the present embodiments, the substrate is preferably made of ceramics, and a wiring pattern is preferably provided on the substrate, the wiring pattern including: cathode and anode electrodes electrically connected to the semiconductor light emitting element; and cathode and anode electrodes electrically connected to the protective element.

Furthermore, in the light emitting device of the present embodiments, a glass layer is preferably provided on a part of the wiring pattern other than at least the cathode and anode electrodes electrically connected to the semiconductor light emitting element, the wiring pattern being provided on the main surface, and the protective element is preferably covered with the glass layer in a case where the protective element is provided on the main surface of the substrate. According to the arrangement, it becomes possible to suppress optical absorption, by the wiring pattern, of light emitted from the semiconductor light emitting element toward the outside.

Moreover, in the light emitting device of the present embodiments, the semiconductor light emitting element is preferably provided between the cathode and anode electrodes electrically connected to the semiconductor light emitting element on the main surface of the substrate; and the protective element is preferably provided on the cathode and anode electrodes electrically connected to the protective element so as to bridge between the cathode and anode electrodes electrically connected to the protective element.

Further, in the light emitting device of the present embodiments, the protective element is preferably covered with a glass layer or a solder resist. According to the arrangement, it becomes possible to suppress optical absorption, by the protective element, of the light emitted from the semiconductor light emitting element toward the outside.

Note that the glass layer or the solder resist is preferably milky white in color so that the effect of suppressing the optical absorption is increased.

In a case where (i) a plurality of light emitting devices constitute a closed-loop circuit while a light emitting module, including the plurality of light emitting devices, is turning off, and (ii) the light emitting module is used in a situation in which outside light is always incident on a part of the plurality of light emitting devices, a plurality of light emitting elements have photo-electromotive force. This may cause the plurality of light emitting elements to be deteriorated. Meanwhile, it becomes possible to prevent such deterioration of the semiconductor light emitting element due to the photo-electromotive force by connecting the protective element (the printed resistor) in parallel with the semiconductor light emitting elements provided in the light emitting device. Further, this can also be a measure against surge.

For this reason, in the light emitting device of the present embodiments, the protective element preferably has a resistance in a range of 1MΩ to 10 GΩ so that (i) the semiconductor light emitting element is not broken due to surge, (ii) the deterioration of the semiconductor light emitting element due to the photo-electromotive force is prevented, (iii) a forward direction leakage component flowing across the protective element does not affect a driving current of the semiconductor light emitting element.

Further, in the light emitting device of the present embodiments, the protective element is preferably partially provided on the main surface of the substrate.

Moreover, in addition to this, it is more preferable to provide the protective element in a corner of the main surface of the substrate.

Furthermore, in the light emitting device of the present embodiments, the glass layer is preferably made from at least one selected from the group consisting of a borosilicate glass, a silica glass, a soda-lime glass, an aluminoborosilicate glass, a zinc borosilicate glass, an aluminosilicate glass, and a phosphate glass.

Moreover, in the light emitting device of the present invention, the glass layer preferably has a reflectivity in a range of 70% to 80%.

Further, in the light emitting device of the present embodiments, the glass layer preferably contains at least one selected from the group consisting of: an inorganic dye made from argil, a titanium oxide, a barium oxide, talc, a barium sulfate, an aluminum hydroxide, silica, mica, a calcium carbonate, a calcium sulfate, or clay; and an organic dye made from polymer beads.

Furthermore, in the light emitting device of the present embodiments, the protective element is preferably provided on the back surface of the substrate.

Moreover, in the light emitting device of the present embodiments, the semiconductor light emitting element is preferably covered with a fluorescent material-containing resin layer or a transmissive resin layer, each provided on the main surface of the substrate, the fluorescent material-containing resin layer being made of a resin containing a fluorescent material, the transmissive resin layer being made of a transmissive resin; a white resin ring member is preferably provided around the semiconductor light emitting element so as to dam the fluorescent material-containing resin layer or the transmissive resin layer; and the protective element is preferably provided on the main surface of the substrate and below the white resin ring member.

The present technology is suitably applicable to not only a field related to a light emitting device including: a semiconductor light emitting element provided on a substrate; and a protective element connected in parallel with the semiconductor light emitting element, but also a field related to a method for manufacturing the light emitting device, particularly a method for providing the protective element. Further, the present technology is widely applicable to fields related to: a light emitting module including a plurality of light emitting devices; a display device including the light emitting module; and the like.

REFERENCE SIGNS LIST

41. Dam sheet
50. Stationary upper mold
51. Movable lower mold
100, 200, 300, 400, 500, 600. Light emitting device
101. Substrate
102. Glass layer
103. LED chip (semiconductor light emitting element)
104. Printed resistor element (protective element)
105. Fluorescent material-containing resin layer
106. Transmissive resin layer
107. Wiring pattern
107a. Cathode electrode (electrode for semiconductor light emitting element)
107b. Anode electrode (electrode for semiconductor light emitting element)
107c, 107d. Electrode for printed resistor electrode (electrode for protective element)
108. Wiring line
401. Resin ring (resin ring member)
601. Polyphthalamide substrate (substrate)
602. Solder resist

The invention claimed is:

1. A light emitting device comprising:
   a substrate;
   one or more semiconductor light emitting elements provided on a main surface of the substrate; and
   a protective element connected in parallel with each one of the semiconductor light emitting elements,
   the protective element being a printed resistor provided in at least one of regions (i) on the main surface of the substrate, (ii) on a back surface of the substrate, and (iii) inside the substrate.

2. The light emitting device as set forth in claim 1, wherein:
   the semiconductor light emitting element is covered with a fluorescent material-containing resin layer or a transmissive resin layer, each provided on the main surface of the substrate, the fluorescent material-containing resin layer being made of a resin containing a fluorescent material, the transmissive resin layer being made of a transmissive resin; and
   the protective element is provided on the main surface and outside the fluorescent material-containing resin layer or the transmissive resin layer.

3. The light emitting device as set forth in claim 2, wherein:
   the fluorescent material-containing resin layer or the transmissive resin layer has a dome shape.

4. The light emitting device as set forth in claim 2, wherein:
   the protective element is provided in a corner of the main surface of the substrate.

5. The semiconductor light emitting element as set forth in claim 1, wherein:
   the semiconductor light emitting element is covered with, via a fluorescent material-containing resin layer made of a resin containing a fluorescent material, a transmissive resin layer made of a transmissive resin, the fluorescent material-containing resin layer and the transmissive resin layer being provided on the main surface of the substrate; and
   the protective element is provided on the main surface of the substrate and outside the transmissive resin layer.

6. The light emitting device as set forth in claim 5, wherein:
   the transmissive resin layer has a dome shape.

7. The light emitting device as set forth in claim 5, wherein:
   the protective element is provided in a corner of the main surface of the substrate.

8. The light emitting device as set forth in claim 1, wherein:
   the substrate is made of ceramics; and
   a wiring pattern is provided on the substrate,
   the wiring pattern including: cathode and anode electrodes electrically connected to the semiconductor light emitting element; and cathode and anode electrically connected to the protective element.

9. The light emitting device as set forth in claim 8, wherein:
a glass layer is provided on a part of the wiring pattern other than at least the cathode and anode electrodes electrically connected to the semiconductor light emitting element, the wiring pattern being provided on the main surface; and
the protective element is covered with the glass layer, in a case where the protective element is provided on the main surface of the substrate.

10. The light emitting device as set forth in claim 8, wherein:
the semiconductor light emitting element is provided between the cathode and anode electrodes electrically connected to the semiconductor light emitting element on the main surface of the substrate; and
the protective element is provided on the cathode and anode electrodes electrically connected to the protective element so as to bridge between the cathode and anode electrodes electrically connected to the protective element.

11. The light emitting device as set forth in claim 9, wherein:
the glass layer is made of at least one selected from the group consisting of a borosilicate glass, a silica glass, a soda-lime glass, an aluminoborosilicate glass, a zinc borosilicate glass, an aluminosilicate glass, and a phosphate glass.

12. The light emitting device as set forth in claim 9, wherein:
the glass layer has a reflectivity in a range of 70% to 80%.

13. The light emitting device as set forth in claim 11, wherein:
the glass layer contains at least one selected from the group consisting of: an inorganic dye made from argil, a titanium oxide, a barium oxide, talc, a barium sulfate, an aluminum hydroxide, silica, mica, a calcium carbonate, a calcium sulfate, or clay; and an organic dye made from polymer beads.

14. The light emitting device as set forth in claim 1, wherein:
the protective element is covered with a glass layer or a solder resist.

15. The light emitting device as set forth in claim 14, wherein:
either the glass layer or the solder resist is milky white in color.

16. The light emitting device as set forth in claim 1, wherein:
the protective element has a resistance in a range of 1 MΩ to 10GΩ.

17. The light emitting device as set forth in claim 1, wherein:
the protective element is partially provided on the main surface of the substrate.

18. The light emitting device as set forth in claim 1, wherein:
the protective element is provided on the back surface of the substrate.

19. The light emitting device as set forth in claim 1, wherein:
the semiconductor light emitting element is covered with a fluorescent material-containing resin layer or a transmissive resin layer, each provided on the main surface of the substrate, the fluorescent material-containing resin layer being made of a resin containing a fluorescent material, the transmissive resin layer being made of a transmissive resin;
a white resin ring member is provided around the semiconductor light emitting element so as to dam the fluorescent material-containing resin layer or the transmissive resin layer; and
the protective element is provided on the main surface of the substrate and below the white resin ring member.

* * * * *